United States Patent
Lieberman

(10) Patent No.: US 8,289,729 B2
(45) Date of Patent: Oct. 16, 2012

(54) PCB INTERCONNECT SCHEME FOR PSU

(75) Inventor: Donald Lieberman, San Jose, CA (US)

(73) Assignee: Corsair Memory, Inc., Fremont, CA (US)

( * ) Notice: Subject to any disclaimer, the term of this patent is extended or adjusted under 35 U.S.C. 154(b) by 246 days.

(21) Appl. No.: 12/714,415

(22) Filed: Feb. 26, 2010

(65) Prior Publication Data

US 2011/0211317 A1     Sep. 1, 2011

(51) Int. Cl.
H05K 7/02 (2006.01)
H05K 7/04 (2006.01)
(52) U.S. Cl. ........................... 361/810; 361/807
(58) Field of Classification Search ............... 361/728, 361/760, 807, 810, 752
See application file for complete search history.

(56) References Cited

U.S. PATENT DOCUMENTS

| | | | |
|---|---|---|---|
| 3,491,267 A | 1/1970 | Goshorn | |
| 4,523,115 A | 6/1985 | Cuneo | |
| 4,768,965 A | 9/1988 | Chang | |
| 4,818,237 A | 4/1989 | Weber | |
| 4,875,871 A | 10/1989 | Booty et al. | |
| 5,028,492 A | 7/1991 | Guenin | |
| 5,236,789 A | 8/1993 | Cowie | |
| 5,241,451 A * | 8/1993 | Walburn et al. | 361/785 |
| 5,242,310 A | 9/1993 | Leung | |
| 5,266,744 A | 11/1993 | Fitzmaurice | |
| 5,519,573 A * | 5/1996 | Cobb et al. | 361/679.32 |
| 5,642,002 A | 6/1997 | Mekanik et al. | |
| 5,756,937 A | 5/1998 | Gleadall | |
| 5,907,475 A * | 5/1999 | Babinski et al. | 361/719 |
| 5,994,647 A | 11/1999 | Avellanet | |
| 6,017,246 A * | 1/2000 | Hisazumi et al. | 439/637 |
| 6,334,798 B1 | 1/2002 | Ushijima et al. | |
| 6,600,658 B2 * | 7/2003 | Iwata | 361/752 |
| 7,052,282 B2 | 5/2006 | Meleck et al. | |
| 7,173,192 B1 | 2/2007 | Griese et al. | |
| 7,419,381 B2 * | 9/2008 | Jang et al. | 439/65 |
| 7,967,613 B2 * | 6/2011 | Zheng | 439/76.1 |
| 8,040,686 B2 * | 10/2011 | Lin et al. | 361/796 |
| 2003/0122457 A1 | 7/2003 | Diaz et al. | |
| 2004/0009693 A1 | 1/2004 | Sweetland | |
| 2004/0064273 A1 | 4/2004 | Le et al. | |
| 2004/0154829 A1 | 8/2004 | Sass | |
| 2005/0159023 A1 | 7/2005 | Tanigawa et al. | |
| 2005/0218869 A1 | 10/2005 | Casebolt et al. | |
| 2006/0002043 A1 | 1/2006 | DiSalvo et al. | |
| 2006/0250757 A1 | 11/2006 | Ezaki | |

(Continued)

OTHER PUBLICATIONS

PCT/US11/26542, PCT International Search Report dated Apr. 27, 2011.

(Continued)

*Primary Examiner* — Hung S Bui
(74) *Attorney, Agent, or Firm* — Carina Tan; Reed Smith LLP

(57) ABSTRACT

An ATX compatible power supply unit having a main printed circuit board and at least one connector printed circuit board that includes at least one outlet connector for use with a DC modular cable, the at least one connector printed circuit board is connected to the main printed circuit board with connectors other than bare or insulated wires to allow high currents to be transferred between the at least one connector printed circuit board and the main printed circuit board at low voltage drops is disclosed.

22 Claims, 26 Drawing Sheets

U.S. PATENT DOCUMENTS

| | | | |
|---|---|---|---|
| 2007/0052437 | A1 | 3/2007 | Bhatti |
| 2007/0167073 | A1 | 7/2007 | Tsai |
| 2008/0101049 | A1 | 5/2008 | Casto et al. |
| 2008/0196870 | A1 | 8/2008 | Attlesey et al. |
| 2008/0207046 | A1 | 8/2008 | Arenas et al. |
| 2008/0314615 | A1 | 12/2008 | Robberding |
| 2009/0039706 | A1 | 2/2009 | Kotlyar et al. |
| 2009/0160255 | A1 | 6/2009 | Grady |
| 2009/0161326 | A1 | 6/2009 | Lin et al. |
| 2009/0213533 | A1 | 8/2009 | Bulucea |
| 2009/0327768 | A1 | 12/2009 | Chen |

OTHER PUBLICATIONS

PCT/US11/26542, PCT Written Opinion of the International Searching Authority dated Apr. 27, 2011.

PCT/US11/26553, PCT International Search Report dated May 6, 2011.

PCT/US11/26553, PCT Written Opinion of the International Searching Authority dated May 6, 2011.

PCT/US11/26547, PCT International Search Report dated May 17, 2011.

PCT/US11/26547, PCT Written Opinion of the International Searching Authority dated May 17, 2011.

APC, The Different Types of AC Power Connectors in North America, White Paper [online], Dec. 2007 [retrieved on Apr. 22, 2011]. Retrieved from the Internet:<URL: http://www/apcmedia.com/salestools/SADE-5TNRML_R0_EN.pdf> pp. 4-6.

Green Point, High-Efficiency 255 W ATX Power Supply Reference Design Documentation Package, on Semiconductor [online], Jan. 2009 [retrieved on Apr. 22, 2011]. Retrieved from the Internet: <URL: http://.www.onsemi.com/pub_link/Collateral/TND359-D.PDF> pp. 4, 6.

* cited by examiner

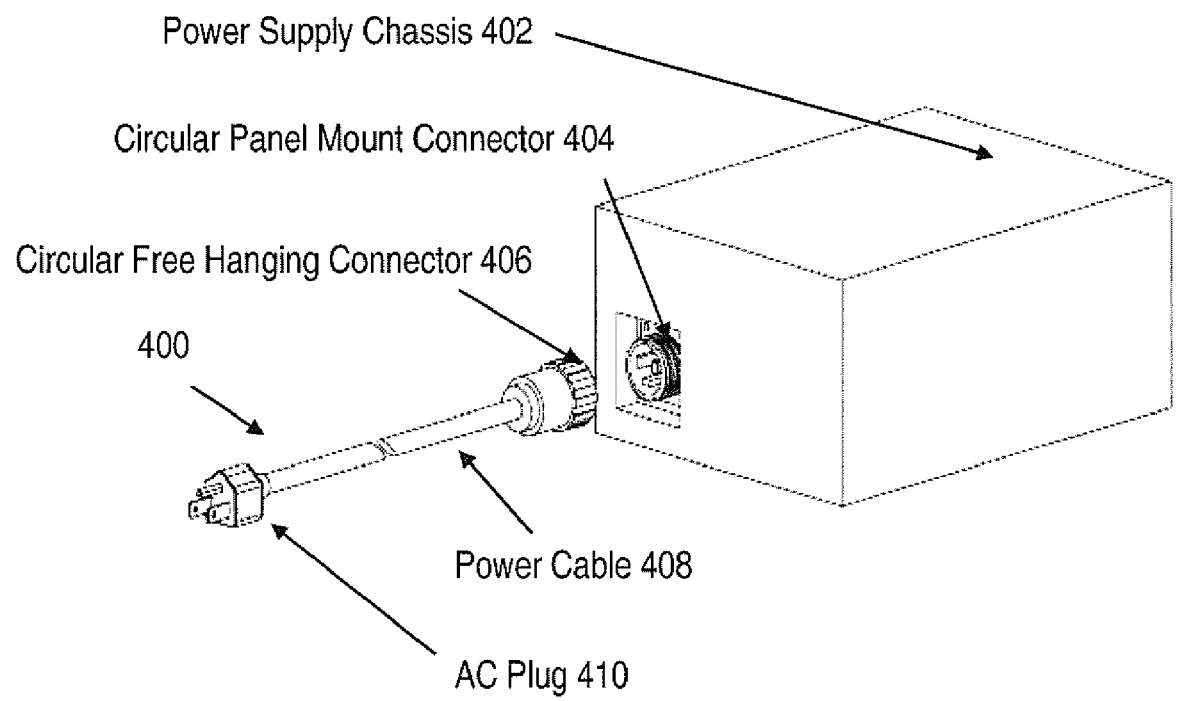
FIG: 4

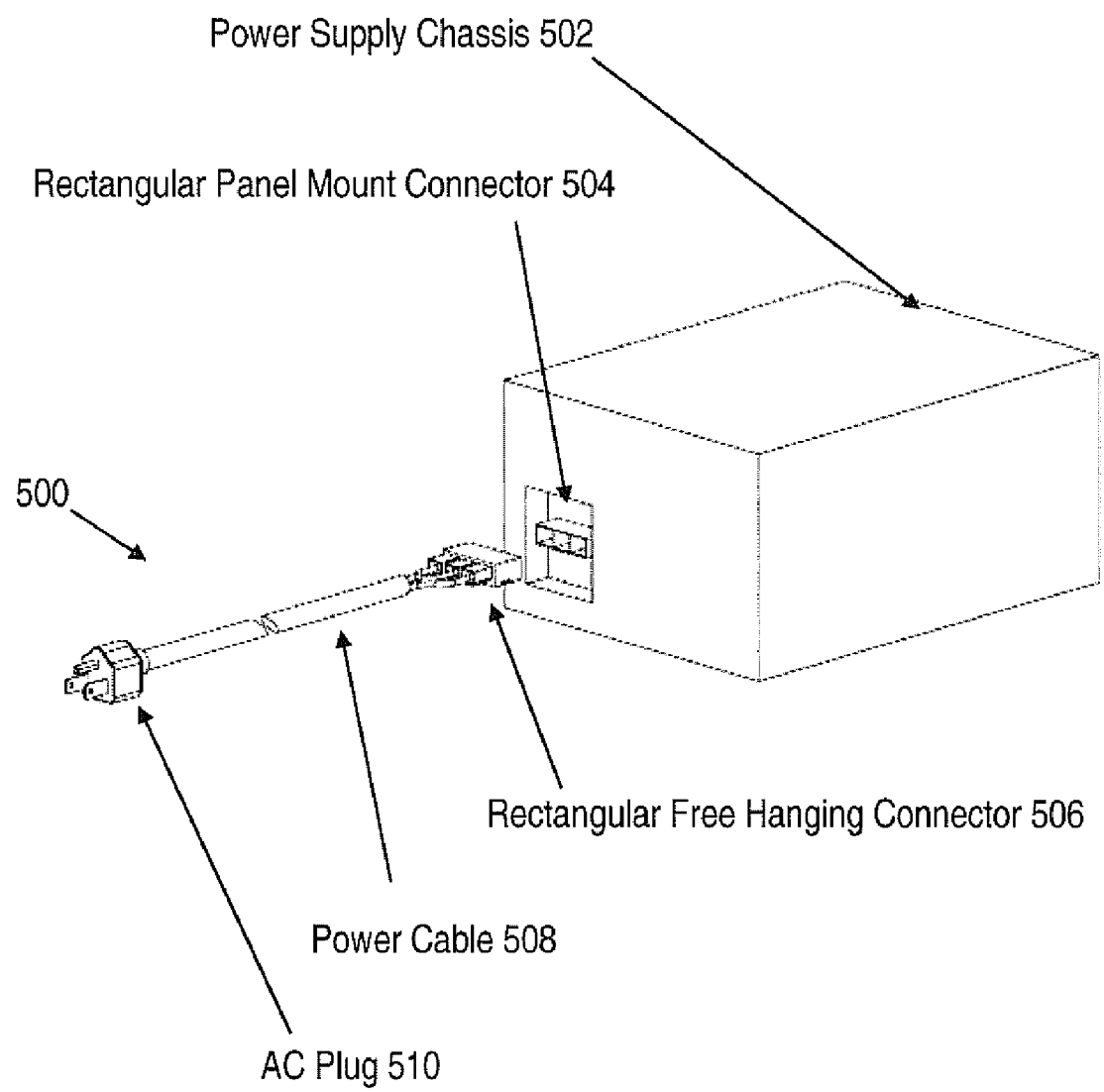

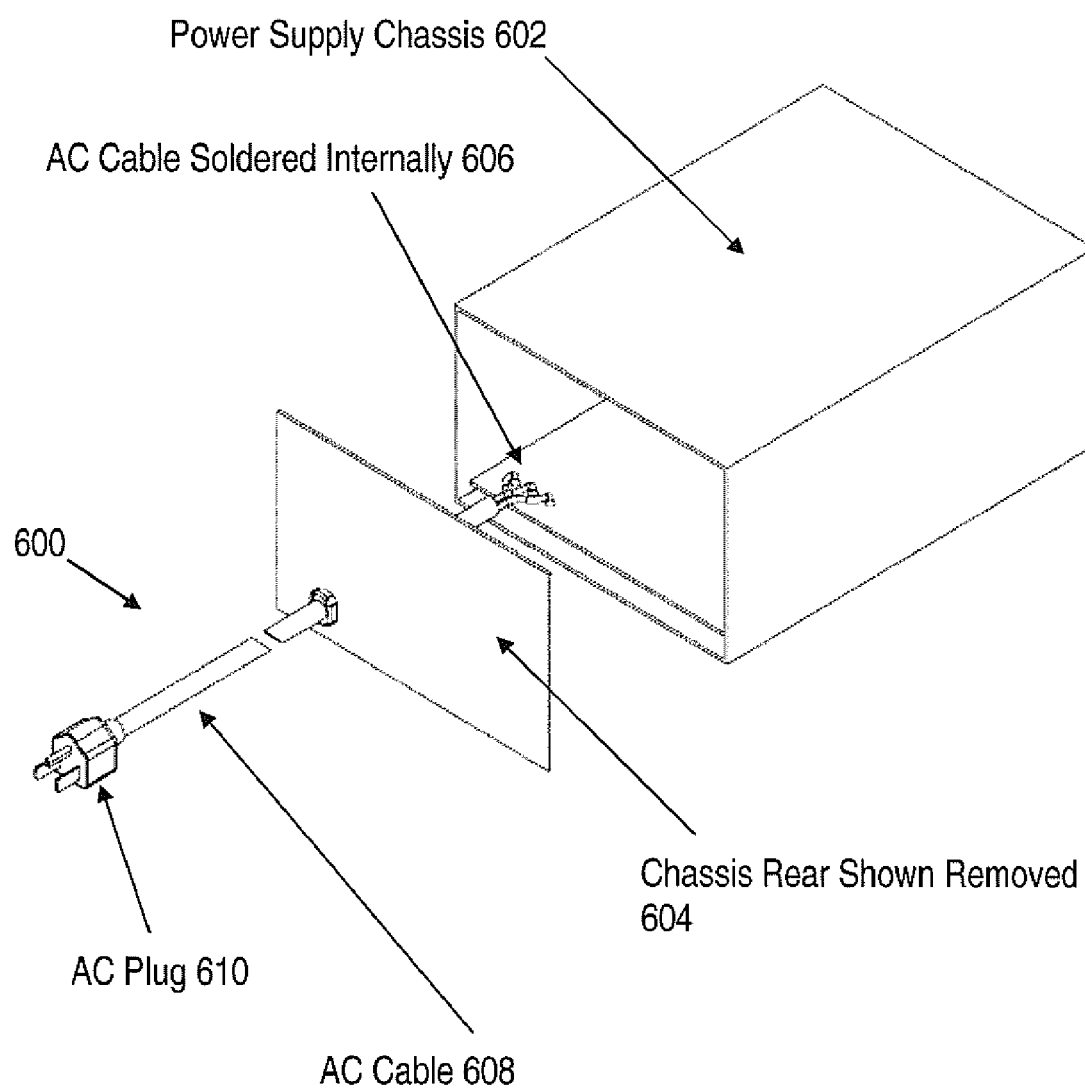

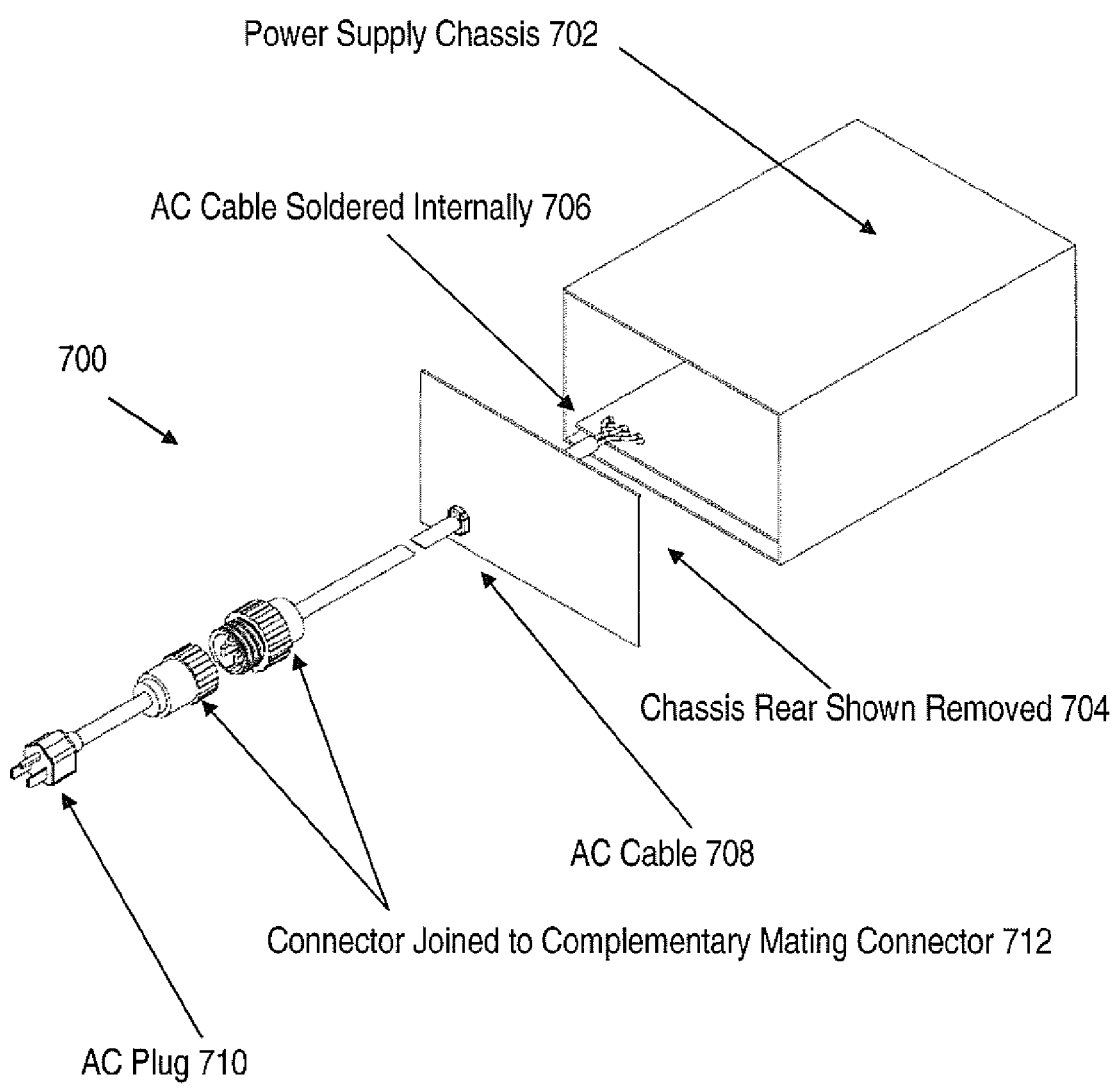

Both Inlets Exposed

Sliding Door Covering Left Inlet

Sliding Door Covering Right Inlet

PCB INTERCONNECT SCHEME FOR PSU

CROSS REFERENCE TO RELATED APPLICATIONS

This application is related to patent application Ser. No. 12/714,366 filed Feb. 26, 2010, entitled, "AC Interconnect Scheme for PSU," by Don Lieberman et al., and patent application Ser. No. 12/714,399 filed Feb. 26, 2010. entitled, "DC Interconnect Scheme for PSU." by Don Lieberman et al.

TECHNICAL FIELD

The present invention is directed to power supply units for computers, and more specifically to aspects relating to the efficiency of power supply units for computers.

BACKGROUND

Personal computers require power supplies commonly referred to as power supply units (PSU) to generate multiple voltages needed for proper operation. The main boards (motherboards) and peripherals of personal computers generally require multiple voltages for operation, including 12 Volts, 5 Volts and 3.3 Volts. Power requirements of the central processing units (CPU) on the motherboards and the video controller integrated circuit (IC) on the peripheral graphics cards have increased dramatically. As a result, the overall power requirements of PSUs for personal computers have increased. High end gaming computers use power supply units that source 1000 or 1200 watts, for example. Most PSUs are configured with industry standard AC input power connectors as described by IEC (International Electrotechnical Commission) specification 60320. Thus, most PSUs for personal computers use IEC connector versions C13 for power cord and C14 power inlets to supply AC power to the computer. However, as alternating current (AC) input currents increase dramatically, IEC 60320 versions C13 and C14 prove less than ideal. The voltage drops across the complete interconnect path including the input AC line cord and power inlet connector from the line source to the neutral return can approach 1 volt at 11.5 amps. This results in a power loss of approximately 11.5 watts which is roughly equivalent to a 0.7% penalty in the overall efficiency ratings of a 1200 watt, 87% efficient PSU. Such losses largely originate from two sources: 1.) The voltage drops in the IEC320 power cord are a result of the use of cable with insufficient diameter (the AWG rating and resistance is too high); 2.) The voltage drops in the IEC320 inlet originate from high contact resistance between the inlet and the mating end of the power cord.

Further, current PSUs use an array of modular cables for direct current (DC) output from the PSU. Such modular cables incorporate sub-optimal connectors having too high contact resistance and wire of too high series resistance and are not optimal for supplying sufficient current while minimizing power losses to key chips on motherboards, daughter cards such as video controller cards, and peripheral devices associated with the computer, for example.

A further problem is the way in which such sub-optimal connectors are wired to the DC output electronics of the PSU. Presently, bundles of wires are used to connect the PSU circuit board containing the DC output regulators to another circuit board containing an array of connectors required when implementing modular cables.

BRIEF DESCRIPTION OF THE DRAWINGS

FIG. 4 illustrates the use of a circular connector in an AC interconnect scheme for use with a PSU that is compatible with PCs and workstations, according to certain embodiments.

FIG. 5 illustrates the use of a rectangular connector in an AC interconnect scheme for use with a PSU that is compatible with PCs and workstations, according to certain embodiments.

FIG. 6 illustrates the use of a direct connection in an AC interconnect scheme for use with a PSU that is compatible with PCs and workstations, according to certain embodiments.

FIG. 7 illustrates the use of a direct connection in an AC interconnect scheme in conjunction with a connector to join a portion of the AC cable that includes the AC plug to the rest of the AC cable connected to the printed circuit board for use with a PSU that is compatible with PCs and workstations, according to certain embodiments.

DETAILED DESCRIPTION

According to certain embodiments, the PSUs as described herein comply with the standards specified in the Advanced Technology Extended (ATX) specification.

The standard specification for the contact resistance for a mated pair of IEC 320 contacts is about 10 milliohms. By reducing both the cable resistance and the contact resistance, the power loss created by an existing AC interconnect scheme can be reduced, according to certain embodiments. This would reduce the power wasted in the cable/inlet combination, thereby increasing the overall efficiency of the system. Further, the temperature of the power cable would be reduced.

Figure 1:
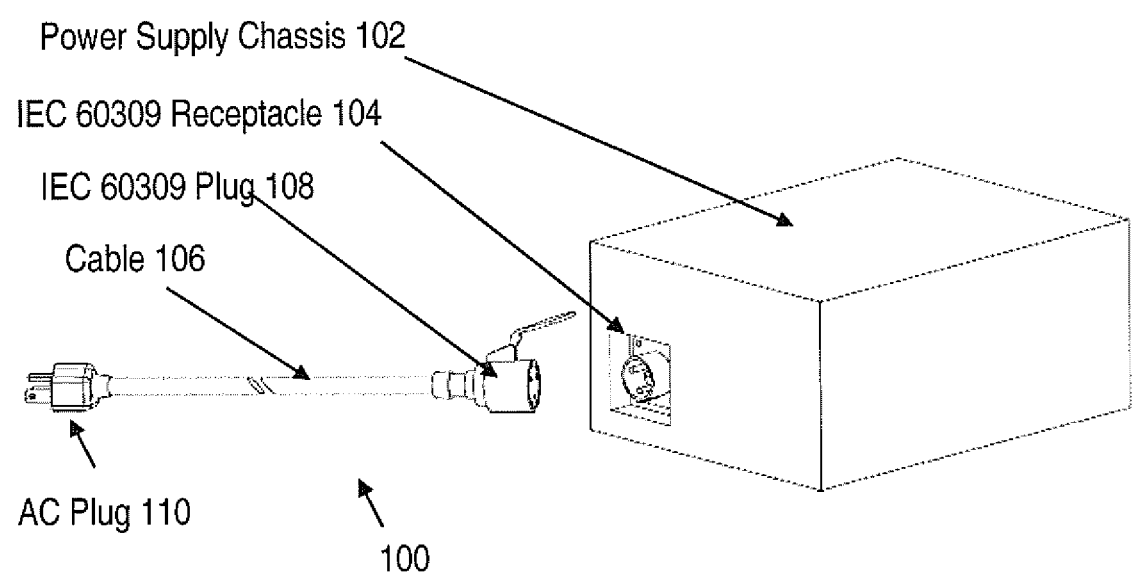
FIG. 1 is a high-level schematic that illustrates the use of IEC 60309 as an AC interconnect for a PSU, according to certain embodiments.

According to certain embodiments, a variety of AC interconnect schemes can replace an IEC 60320 C13 power cord inserted in an IEC 60320 C14 inlet for AC interconnect for use with high current power supply units that are compatible with computers such as personal computers and workstations. Features of suitable replacement AC interconnect schemes include the ability to support comparatively low gauge wire that offers low series resistance coupled with connectors that offer low contact resistance at connector mating interfaces, according to certain embodiments. Further, such replacement interconnect schemes permit the use of a variety of AC plugs depending on the country (and its electrical codes) in which the PSU is used so that power can be sourced in any country in the world. According to some embodiments, the variety of AC interconnect schemes do not replace an IEC 60320 C13 power cord inserted in an IEC 60320 C14 inlet but rather are added to the power supply units for purposes of achieving backwards compatibility with the existing industry standard. A non-limiting example of a suitable AC interconnect is the IEC 60309. The IEC 60309 has higher AC current capabilities than the IEC 60320. FIG. 1 is a high-level schematic that illustrates the use of IEC 60309 as an AC interconnect for a PSU, according to certain embodiments.

According to certain embodiments, FIG. 1 shows a PSU chassis 102, an AC interconnect 100 that includes a power cable 106, AC plug 110, an IEC 60309 plug 108 that plugs into IEC 60309 receptacle 104. IEC 60309 receptacle 104 is on PSU chassis 102. Voltage drops at high currents across a single IEC 60320 C13 AC cable are reduced. Less heat is dissipated than in the standardized single IEC 60320 C14 chassis plug inlet. Overall efficiencies are thus increased. The AC plug 110 shown in FIG. 1 is a standard AC plug that is compatible with US electrical standards. However, the AC plug can be any international plug type depending on the country in which the PSU is used. Some non-limiting examples of AC plug types are shown in FIG. 2.

Figure 2:
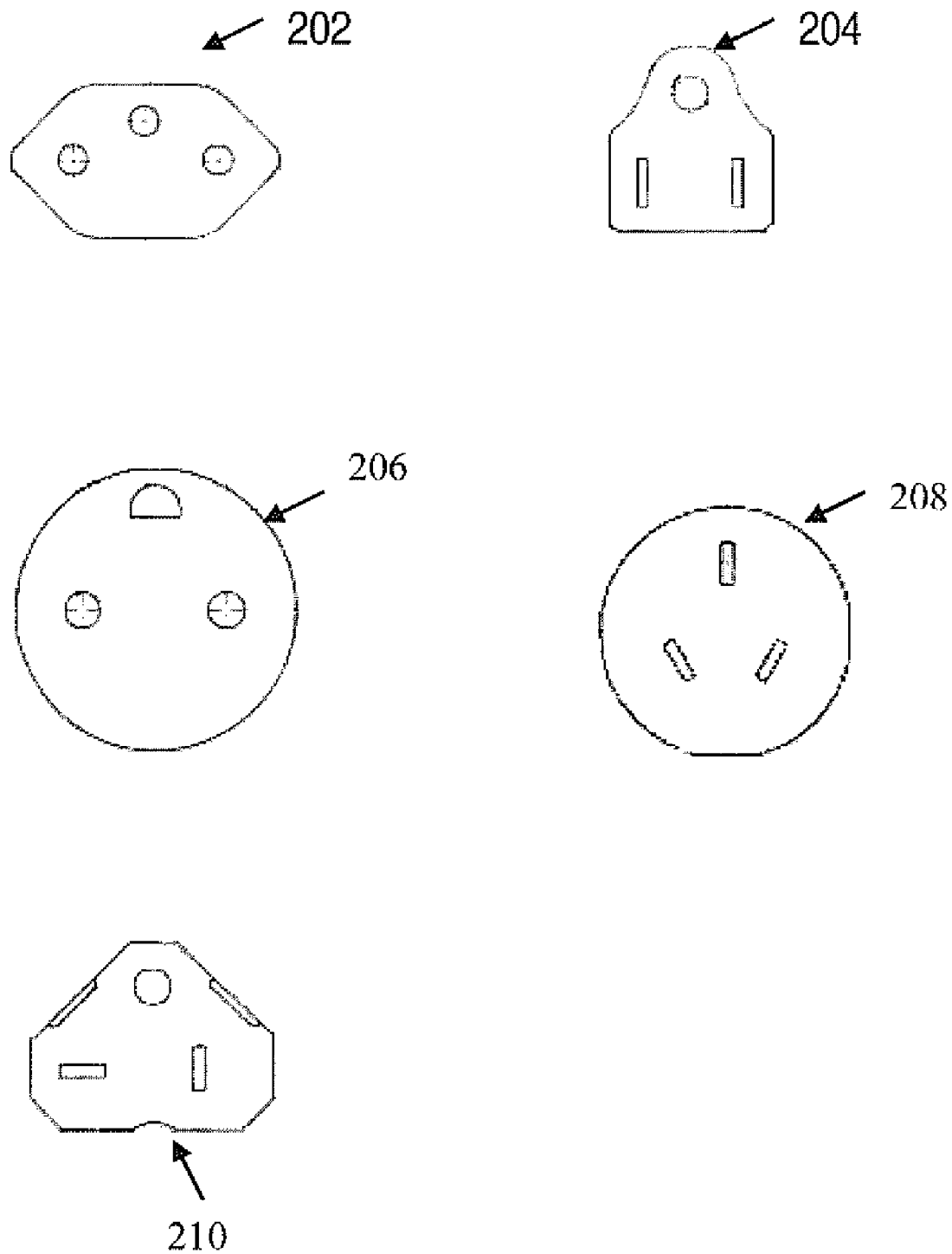
FIG. 2 illustrates some international plug types, according to certain embodiments.

FIG. 2 illustrates international plug types 202, 204, 206, 208 and 210, according to certain embodiments. The embodiments are not limited to the international plug types shown in FIG. 2.

As previously mentioned, the embodiments are not limited to the IEC 60309 as a suitable AC interconnect. Various AC interconnect schemes can be used in the embodiments. FIGS. 3-6 show a variety of AC interconnect schemes that can replace the IEC 60320 C13 power cord inserted into a single IEC 60320 C14 inlet, according to certain embodiments.

Figure 3A:
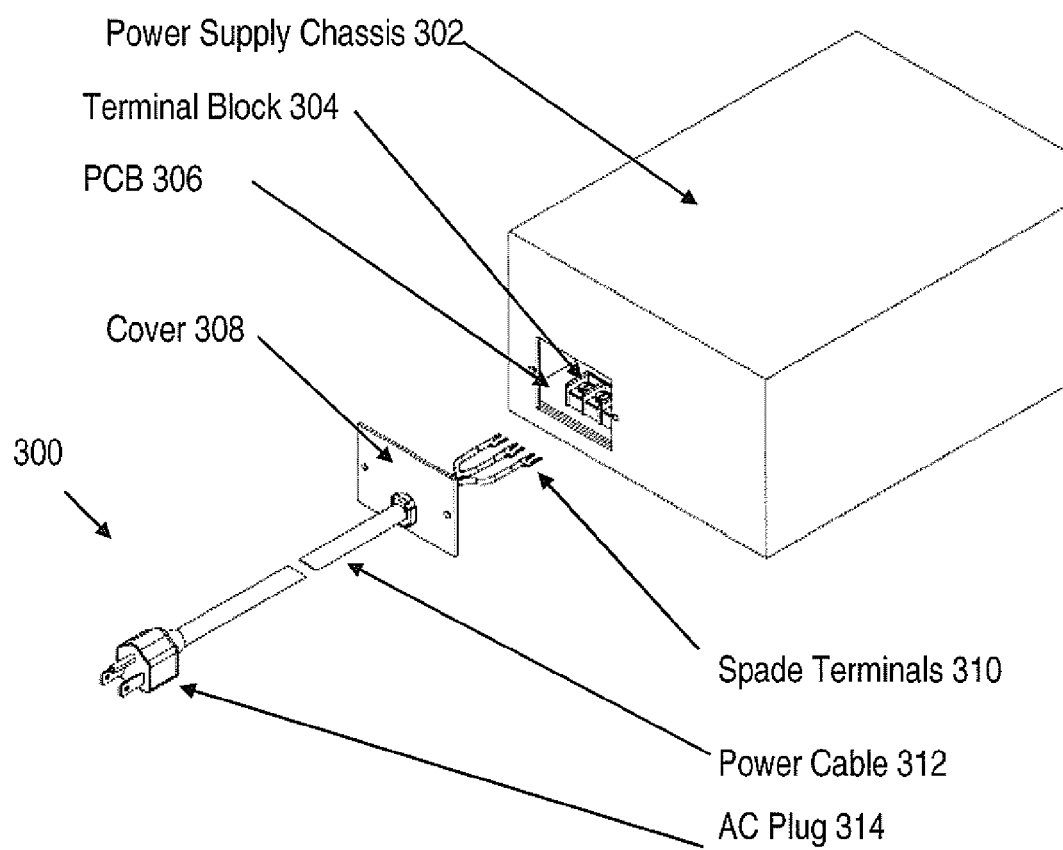
FIG. 3A and FIG. 3B illustrate the use of a terminal block in an AC interconnect scheme for use with a PSU that is compatible with PCs and workstations, according to certain embodiments.
Figure 3B:
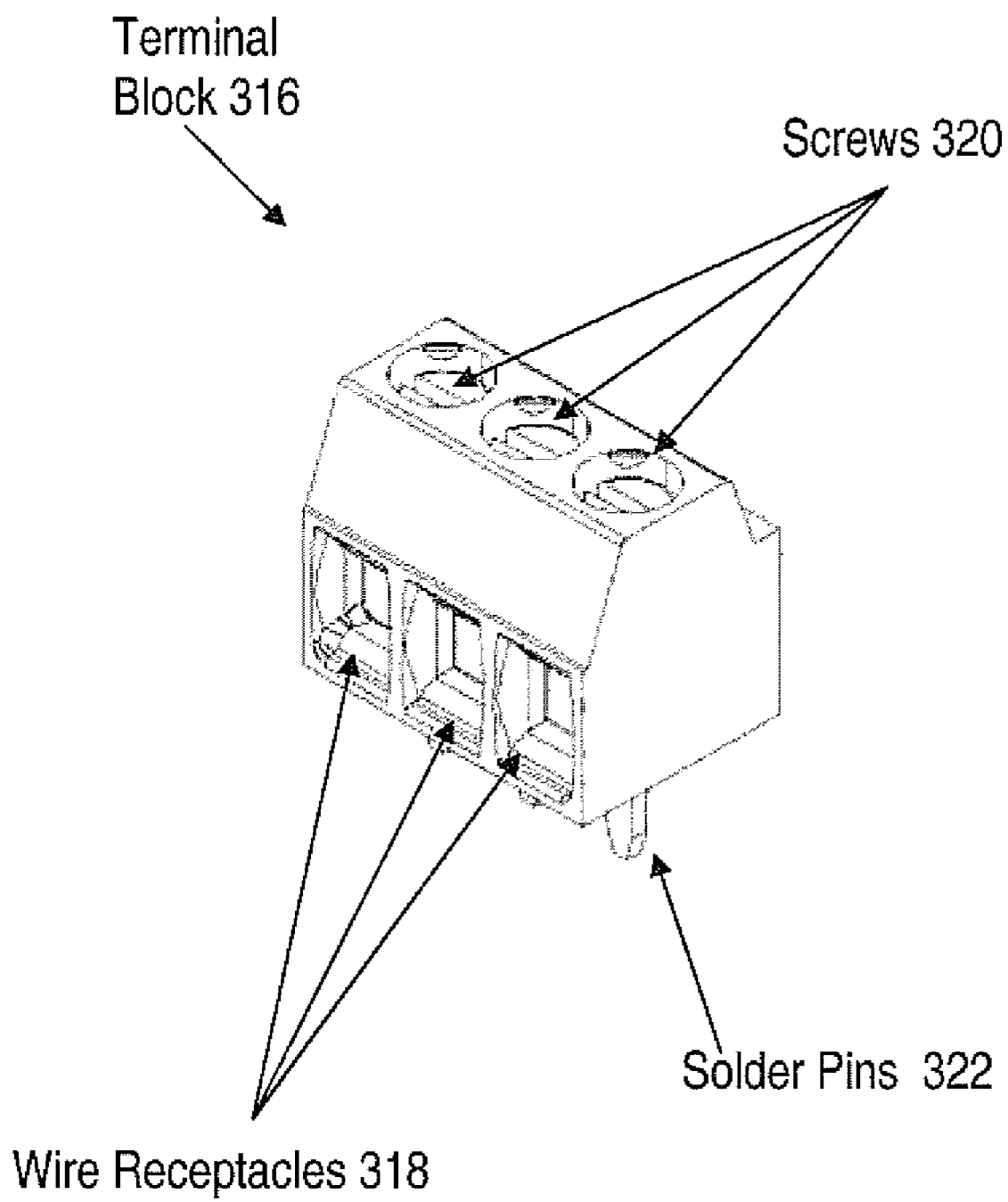

According to certain embodiments, FIG. 3A illustrates the use of a terminal block in an AC interconnect scheme for use with a PSU that is compatible with PCs and workstations. FIG. 3A shows a PSU chassis 302, an AC interconnect 300 that includes an AC power cable 312, AC plug 314, a terminal cover 308 and spade or lug terminals 310 that are screwed onto a terminal block 304 mounted on a printed circuit board 306 (PCB) inside PSU chassis 302. For example, the stripped ends of each wire comprising AC power cable 312 may be crimped or soldered to the appropriate end of each spade or lug terminal 310. Terminal block 304 replaces the standard IEC 60320 inlet. Terminal cover 308 may be a removable cover that meets international electrical safety standards. The AC power cable 312 has conductors with a wire gauge suitable for low voltage drops at high currents (e.g., less than AWG 16 gauge). In such an AC interconnect scheme, the voltage drops at high currents across the AC cable are reduced. Less heat is dissipated in terminal block 304 than in the standardized single IEC 60320 C14 chassis plug inlet. Overall efficiencies are thus increased. The AC plug 314 shown in FIG. 3A is a standard AC plug that is compatible with US electrical standards. However, the AC plug can be any international plug type depending on the country in which the PSU is used. As previously mentioned, non-limiting examples of AC plug types are shown in FIG. 2. According to certain other embodiments, spade terminals 310 can be bolted directly to the printed circuit board 306 (PCB) inside PSU chassis 302. In such an embodiment, terminal block 304 is not used. According to yet other embodiments, no spade or lug terminals are used for connecting to some types of terminal blocks. For example, FIG. 3B shows a terminal block 316. Terminal block 316 includes wire receptacles 318 that can receive stripped ends of each wire comprising a power cable (not shown in FIG. 3B). Such stripped ends can be tinned with solder, for example, and are secured to terminal block 316 by tightening set screws 320 to clamp down on the stripped ends. Terminal block 316 can be secured to the printed circuit board (PCB) inside PSU chassis by solder pins 322.

According to certain embodiments, FIG. 4 illustrates the use of a circular connector in an AC interconnect scheme for use with a PSU that is compatible with PCs and workstations. FIG. 4 shows a PSU chassis 402, an AC interconnect 400 that includes an AC power cable 408, AC plug 410 and a circular free hanging connector 406 that mates with circular panel mount connector 404 mounted on a PSU chassis 402. For example, the stripped ends of each wire comprising AC power cable 408 can be soldered or crimped to the pins (not shown) that can be inserted into circular free hanging connector 406. Circular free hanging connector 406 and circular panel mount connector 404 may have threaded housings so that circular free hanging connector 406 can be screwed onto the circular panel mount connector 404, for example. As another example, circular free hanging connector 406 and the circular panel mount connector 404 have bayonet type housings to allow the circular free hanging connector 406 to be mated to the circular panel mount connector 404. Circular panel mount connector 404 replaces the standard IEC 60320 inlet. The AC power cable 408 has conductors with a wire gauge suitable for low voltage drops at high currents (e.g., less than AWG 16 gauge). In such an AC interconnect scheme, the voltage drops at high currents across the AC cable are reduced. Less heat is dissipated in circular panel mount connector 404 than in the standardized single IEC 60320 C14 chassis plug inlet. Overall efficiencies are thus increased. The AC plug 410 shown in FIG. 4 is a standard AC plug that is compatible with US electrical standards. However, the AC plug can be any international plug type depending on the country in which the PSU is used. As previously mentioned, non-limiting examples of AC plug types are shown in FIG. 2.

According to certain embodiments, FIG. 5 illustrates the use of a rectangular connector in an AC interconnect scheme for use with a PSU that is compatible with PCs and workstations. FIG. 5 shows a PSU chassis 502, an AC interconnect 500 that includes an AC power cable 508, AC plug 510 and a rectangular free hanging connector 506 that mates with rectangular panel mount connector 504 mounted on a PSU chassis 502. For example, the stripped ends of each wire comprising AC power cable 508 can be soldered or crimped to the pins (not shown) that can be inserted into rectangular free hanging connector 506. Rectangular free hanging connector 506 can be inserted into the complementary rectangular panel mount connector 504 (pins not shown). Rectangular free hanging connector 506 and complementary rectangular panel mount connector 504 can have housings that employ mechanical latching mechanism, or flexible plastic latches or threaded fasteners, for example. Rectangular panel mount connector 504 replaces the standard IEC 60320 inlet. The AC power cable 508 has conductors with a wire gauge suitable for low voltage drops at high currents (e.g., less than AWG 16 gauge). In such an AC interconnect scheme, the voltage drops at high currents across the AC cable are reduced. Less heat is dissipated in rectangular panel mount connector 504 than in the standardized single IEC 60320 C14 chassis plug inlet. Overall efficiencies are thus increased. The AC plug 510 shown in FIG. 5 is a standard AC plug that is compatible with US electrical standards. However, the AC plug can be any international plug type depending on the country in which the PSU is used. As previously mentioned, non-limiting examples of AC plug types are shown in FIG. 2.

According to certain embodiments, FIG. 6 illustrates the use of a direct connection in an AC interconnect scheme for use with a PSU that is compatible with PCs and workstations. FIG. 6 shows a PSU chassis 602, chassis rear shown removed 604, an AC interconnect 600 that includes an AC power cable 608, AC plug 610 and the stripped ends 606 of AC cable soldered or bolted to the printed circuit board in the PSU chassis 602. The stripped ends 606 that are soldered or bolted to the printed circuit board replace the standard IEC 60320 inlet. The AC power cable 608 has conductors with a wire gauge suitable for low voltage drops at high currents (e.g., less than AWG 16 gauge). In such an AC interconnect scheme, the voltage drops at high currents across the AC cable are reduced. Less heat is dissipated in the stripped ends 606 that are soldered or bolted to the printed circuit board than in the standardized single IEC 60320 C14 chassis plug inlet. Overall efficiencies are thus increased. The AC plug 610 shown in FIG. 6 is a standard AC plug that is compatible with US electrical standards. However, the AC plug can be any international plug type depending on the country in which the PSU is used. As previously mentioned, non-limiting examples of AC plug types are shown in FIG. 2.

According to certain embodiments, FIG. 7 illustrates the use of a direct connection in an AC interconnect scheme in conjunction with a connector to join a portion of the AC cable that includes the AC plug to the rest of the AC cable connected to the printed circuit board for use with a PSU that is compatible with PCs and workstations. FIG. 7 shows a PSU chassis 702, chassis rear shown removed 704, an AC interconnect 700 that includes an AC power cable 708, AC plug 710, mated pair of connectors 712, and the stripped ends 706 of AC cable soldered or bolted to the printed circuit board in the PSU chassis 702. The stripped ends 706 that are soldered or bolted to the printed circuit board replace the standard IEC 60320 inlet. The mated pair of connectors 712 connect the portion of the AC cable 708 that includes the AC plug to the rest of the AC cable connected to the printed circuit board. The AC power cable 708 has conductors with a wire gauge suitable for low voltage drops at high currents (e.g., less than AWG 16 gauge). In such an AC interconnect scheme, the voltage drops at high currents across the AC cable are reduced. Less heat is dissipated in the combination of the connector joined to complementary mating connector 712 and AC cable soldered internally 706 than in the standardized single IEC 60320 C14 chassis plug inlet. Overall efficiencies are thus increased. The AC plug 710 shown in FIG. 7 is a standard AC plug that is compatible with US electrical standards. However, the AC plug can be any international plug type depending on the country in which the PSU is used. As previously mentioned, non-limiting examples of AC plug types are shown in FIG. 2.

Figure 8A:
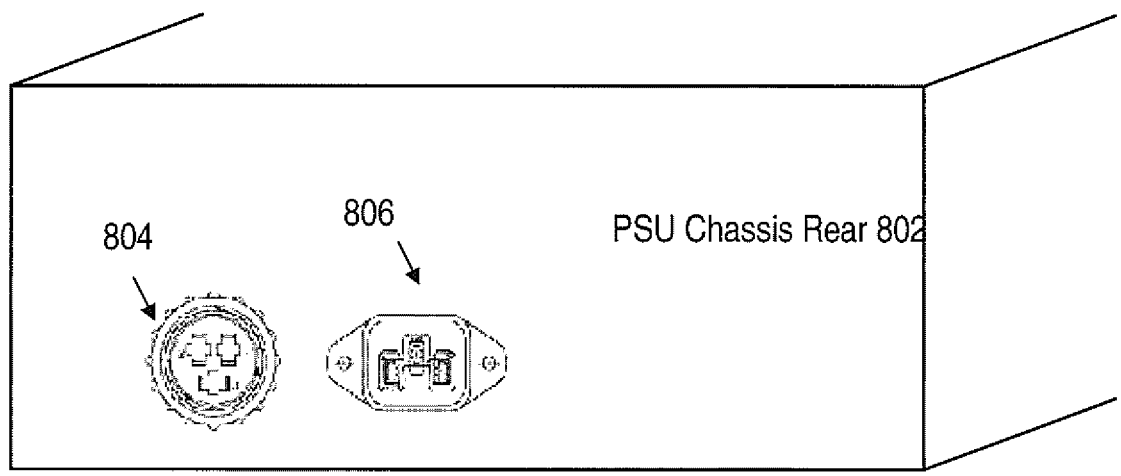
FIGS. 8A-C illustrate the use of multiple connectors associated with AC power cables on a PSU, according to certain embodiments.
Figure 8B:
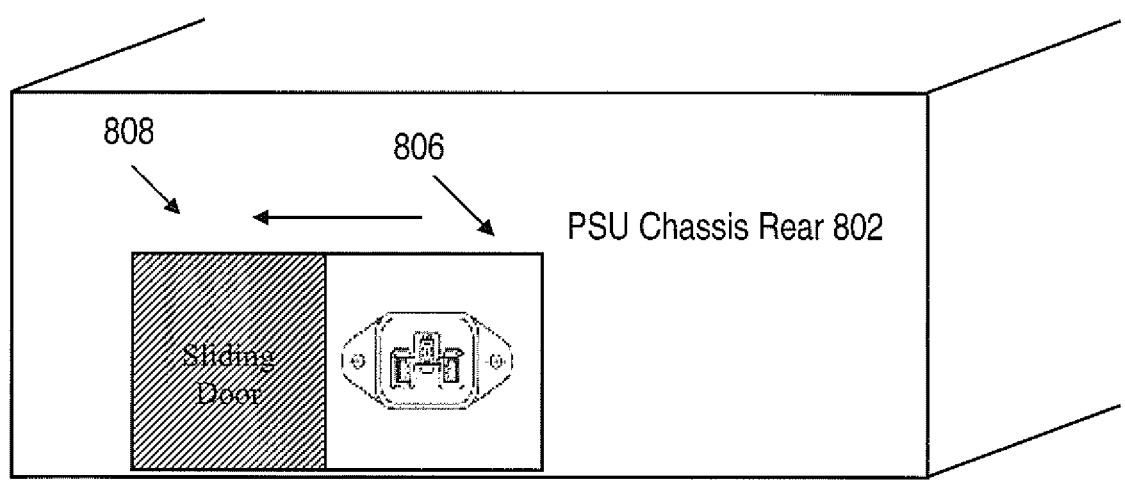
Figure 8C:
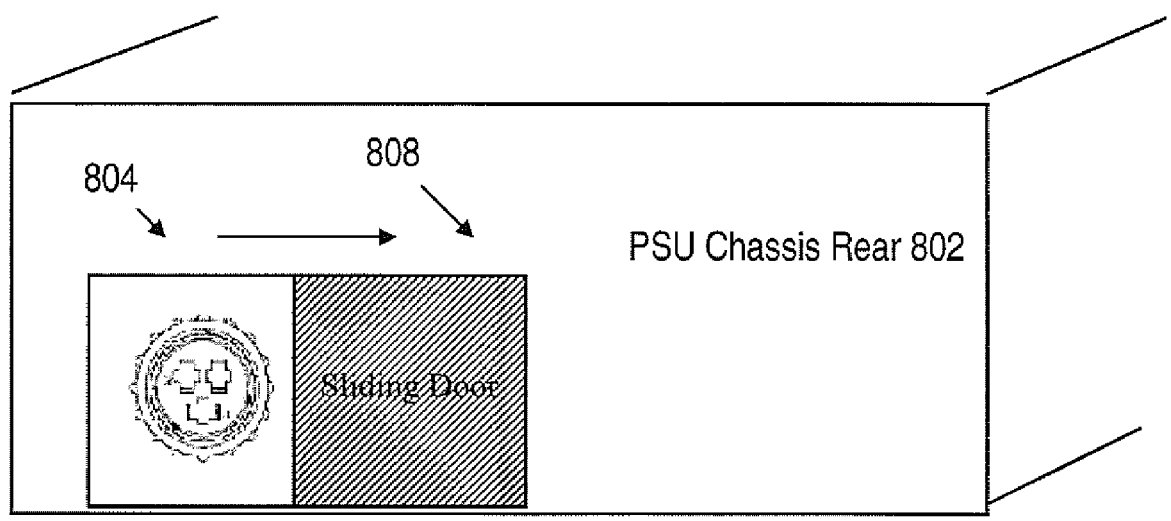

According to certain embodiments, FIGS. 8A-C illustrate the use of multiple connectors associated with AC power cables on a PSU. The implementation illustrated in FIGS. 8A-C present an implementation that is backward compatible with the existing IEC320 systems and also allow an option for installing a high efficiency AC power cable, thus limiting the voltage drop and thereby reducing the power wasted in the interconnect, according to certain embodiments. FIG. 8A shows two dissimilar inlets 804 and 806 mounted adjacent to one another on a PSU chassis 802. As a non-limiting example, inlet 806 may the standard IEC 60320 C14 and inlet 804 is an inlet with a higher current carrying capacity (e.g., IEC 60309 C14 inlet, terminal block, circular panel mount connector, or rectangular panel mount connector). Such a configuration allows a user to select between the standard IEC 60320 C14 inlet 806 and the more robust inlet 804 that has a higher current carrying capacity.

According to certain embodiments, FIGS. 8B and 8C show a sliding door 808. Sliding door 808 is configured such that either inlet 804 or inlet 806 can be exposed for use. Sliding door 808 is a safety feature and covers the inlet that is not in use.

According to certain embodiments, modular cables for direct current (DC) output from the PSU are designed with DC modular cable interconnect schemes. Each PSU may have multiple modular cables for use with various peripherals of the computer. According to certain embodiments, connectors with lower contact resistance coupled with wire of higher diameter are used to lower voltage drops and thus lower power losses. According to certain embodiments, a given DC modular cable has a connector that has a large contact area at the end portion of the DC modular cable that connects to the PSU. The other end of the DC modular cable that does not connect to the PSU ends in a connector that is compatible with existing peripheral implementations. Further, each DC modular cable has wiring of less than AWG 16 gauge. Such DC modular cable interconnect schemes reduce series resistance, increase reliability and reduce cost. Various DC modular cable interconnect schemes can be used in the embodiments. FIGS. 9-15 show a variety of DC cable interconnect schemes. For ease of explanation, each of FIGS. 9-15 show only one connector on the PSU chassis. However, the embodiments are not limited to only one modular cable. According to some embodiments, the PSU can include an array of connectors of various types or the same type for use with a corresponding set of DC modular cables. Further, the interconnect schemes as shown in FIGS. 9-15 include at least two conductors, one for power and one for ground, according to certain embodiments. For example, the interconnect uses even multiples of two conductors (multiple power-ground pairs). However, there may be specific circumstances in which an odd number of conductors would be employed. FIGS. 12-15 show two conductors for each interconnect.

Figure 9:
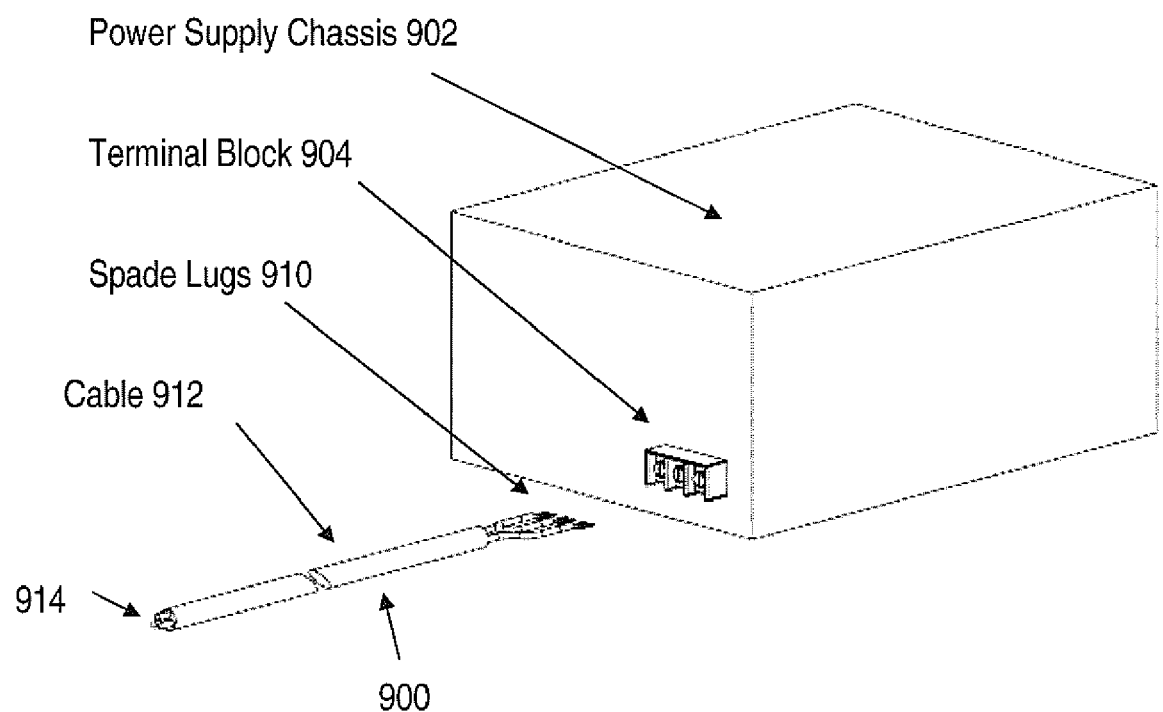
FIG. 9 illustrates the use of a terminal block in a DC modular cable interconnect scheme for use with a PSU that is compatible with PCs and workstations, according to certain embodiments.

According to certain embodiments, FIG. 9 illustrates the use of a terminal block in a DC modular cable interconnect scheme for use with a PSU that is compatible with PCs and workstations. FIG. 9 shows a PSU chassis 902, a DC modular cable interconnect 900 that includes a power cable 912, a connector 914 (not shown) for connecting to a computer peripheral and spade lugs 910 that are screwed onto a terminal block 904 mounted on a printed circuit board (PCB) inside PSU chassis 902. Stripped ends of each wire comprising one end of power cable 912 can be crimped or soldered onto spade lugs 910, for example. Power cable 912 has conductors with a wire suitable for low voltage drops at high currents (e.g., less than AWG 16 gauge). According to certain embodiments, no spade or lug terminals are used for connecting to some types of terminal blocks. For example, FIG. 3B shows a terminal block 316. Terminal block 316 includes wire receptacles 318 that can receive stripped ends of each wire comprising a power cable (not shown in FIG. 3B). Such stripped ends can be tinned with solder, for example, and are secured to terminal block 316 by tightening set screws 320 to clamp on the stripped ends. Terminal block 316 can be secured to the printed circuit board (PCB) inside PSU chassis by solder pins 322.

Figure 10:
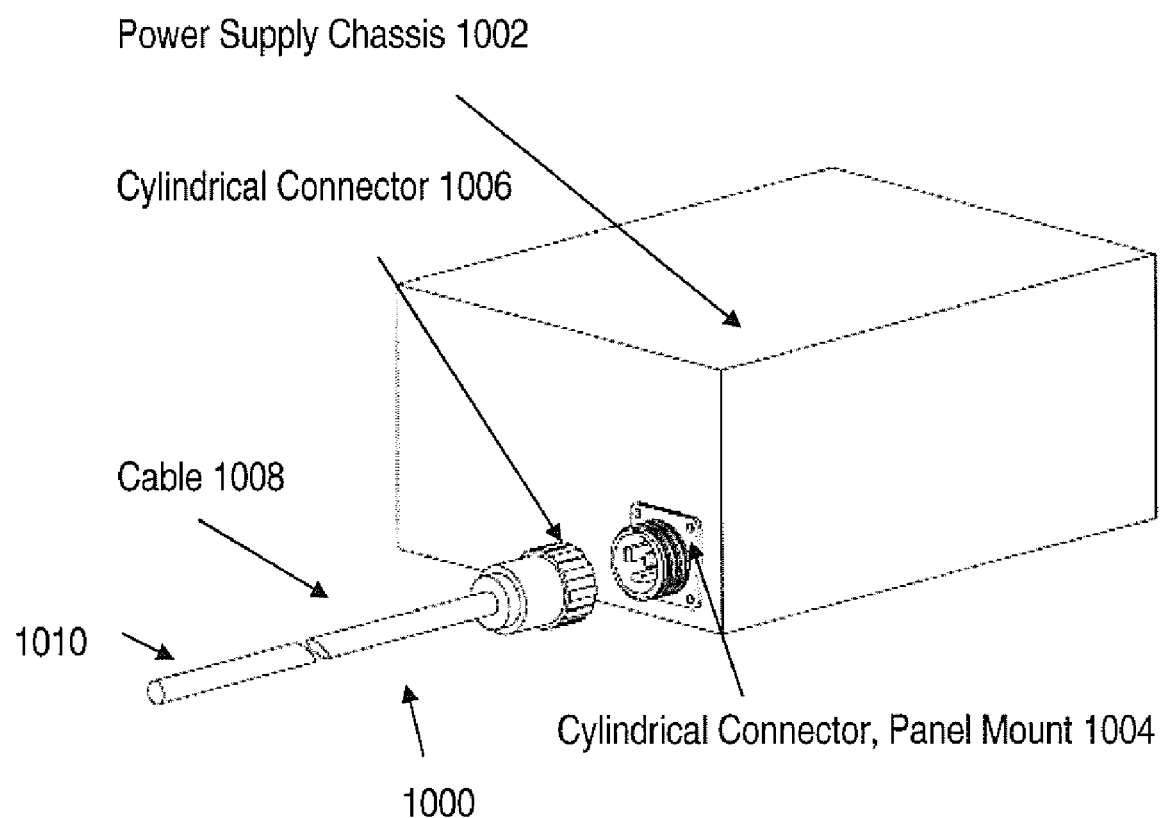
FIG. 10 illustrates the use of a circular connector in a DC modular cable interconnect scheme for use with a PSU that is compatible with PCs and workstations, according to certain embodiments.

According to certain embodiments, FIG. 10 illustrates the use of a circular connector in a DC modular cable interconnect scheme for use with a PSU that is compatible with PCs and workstations. FIG. 10 shows a PSU chassis 1002, a DC modular cable interconnect 1000 that includes a power cable 1008, a connector 1010 (not shown) for connecting to a computer peripheral and a circular free hanging connector 1006 that mates with circular panel mount connector 1004 mounted on a PSU chassis 1002. Stripped ends of each wire comprising power cable 1008 can be soldered or crimped to the pins (not shown) that can be inserted into circular free hanging connector 1006, for example. Circular free hanging connector 1006 and circular panel mount connector 1004 may have threaded housings so that circular free hanging connector 1006 can be screwed onto the circular panel mount connector 1004, for example. As another example, circular free hanging connector 1006 and the circular panel mount connector 1004 have bayonet type housings to allow the circular free hanging connector 1006 to be mated to the circular panel mount connector 1004. The power cable 1008 has conductors with a wire gauge suitable for low voltage drops at high currents (e.g., less than AWG 16 gauge).

Figure 11:
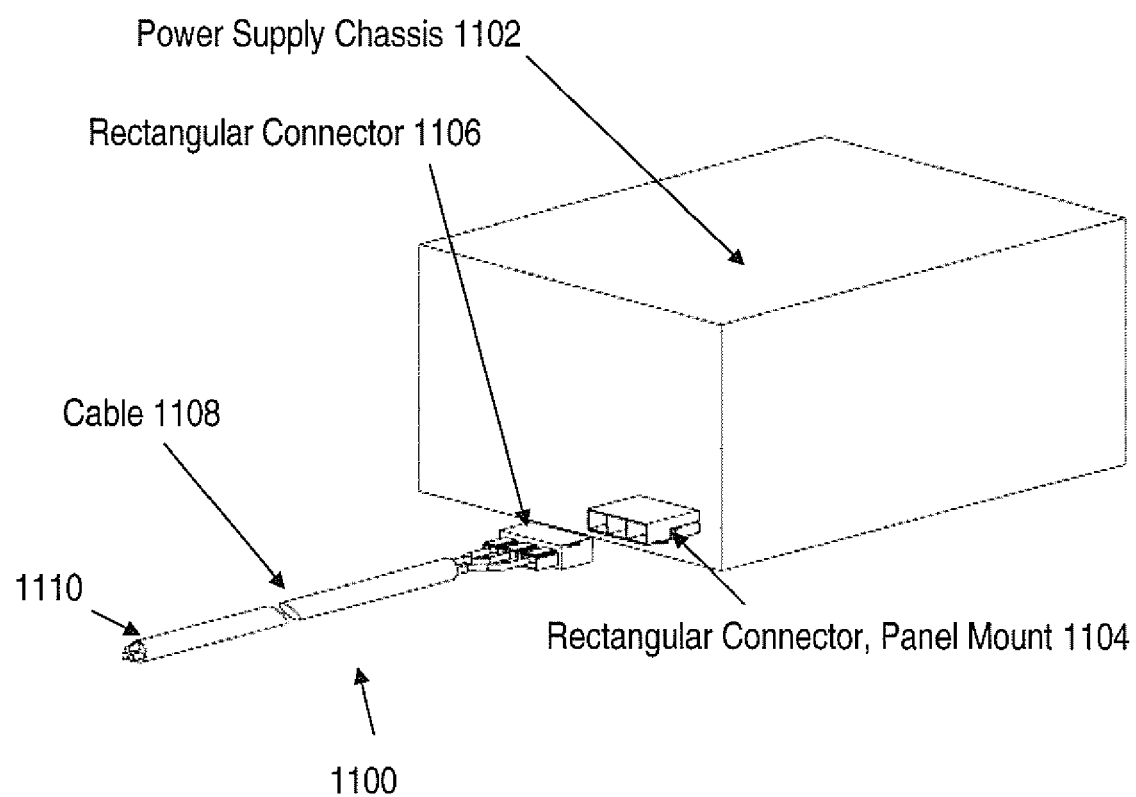
FIG. 11 illustrates the use of a rectangular connector in a DC modular cable interconnect scheme for use with a PSU that is compatible with PCs and workstations, according to certain embodiments.

According to certain embodiments, FIG. 11 illustrates the use of a rectangular connector in a DC modular cable interconnect scheme for use with a PSU that is compatible with PCs and workstations. FIG. 11 shows a PSU chassis 1102, a DC modular cable interconnect 1100 that includes a power cable 1108, connectors 1110 (not shown) for connecting to a computer peripheral and a rectangular free hanging connector 1106 that mates with rectangular panel mount connector 1104 mounted on a PSU chassis 1102. For example, the stripped ends of each wire comprising one end of power cable 1108 can be soldered or crimped to the pins (not shown) that can be inserted into rectangular free hanging connector 1106. Rectangular free hanging connector 1106 can be inserted into the complementary rectangular panel mount connector 1104 (pins not shown). Rectangular free hanging connector 1106 and complementary rectangular panel mount connector 1104 can have housings that employ mechanical latching mechanism, or flexible plastic latches or threaded fasteners, for example. The power cable 1108 has conductors with a wire gauge suitable for low voltage drops at high currents (e.g., less than AWG 16 gauge).

Figure 12:
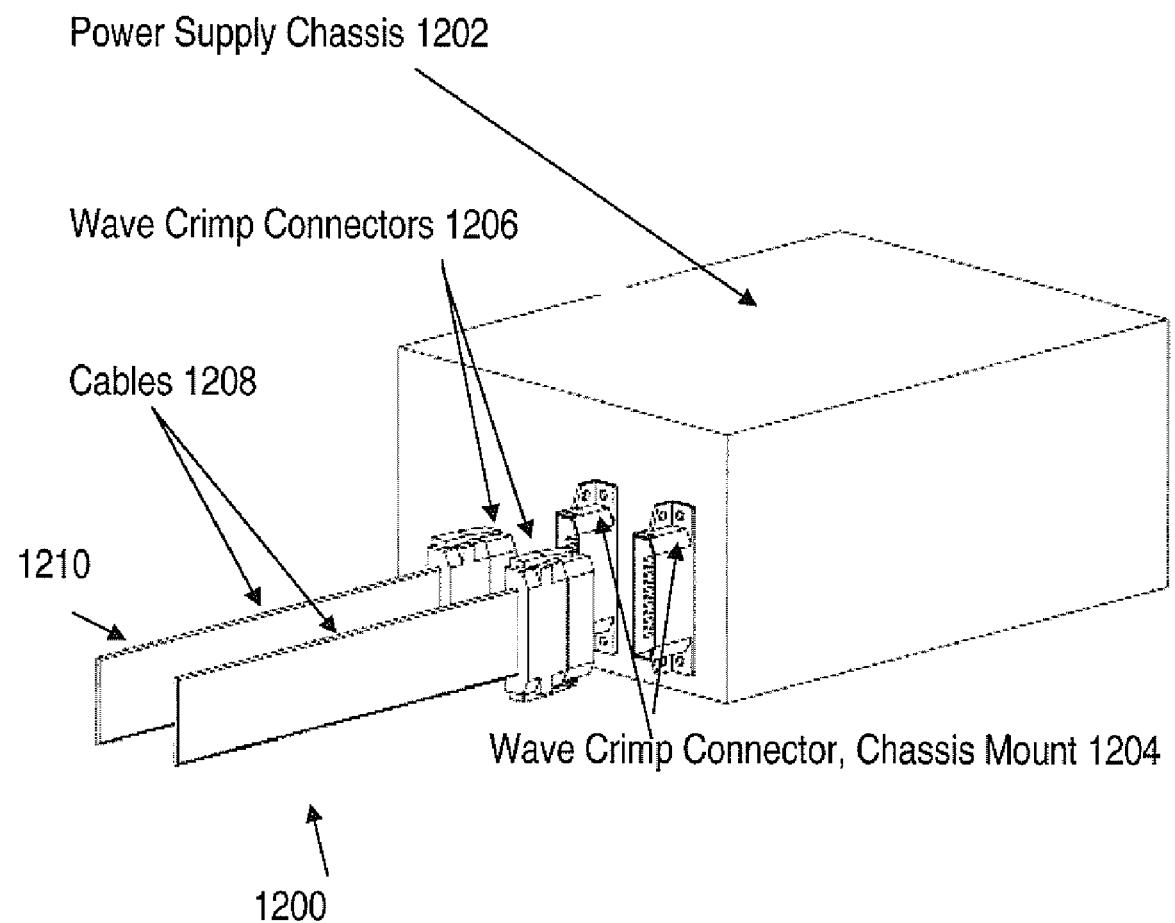
FIG. 12 illustrates the use of wave crimp connectors in a DC modular cable interconnect scheme for use with a PSU that is compatible with PCs and workstations, according to certain embodiments.

According to certain embodiments, FIG. 12 illustrates the use of a wave crimp connector in a DC modular cable interconnect scheme for use with a PSU that is compatible with PCs and workstations. FIG. 12 shows a PSU chassis 1202, a DC modular cable interconnect 1200 that includes two power cables 1208 (one for DC voltage and the other for ground return), a connector 1210 (not shown) for connecting to a computer peripheral and a wave crimp connector 1206 that mates with wave crimp chassis mount connector 1204 mounted on a PSU chassis 1202. Wave crimp connector 1206 can be inserted into the complementary wave crimp mount connector 1204. Each power cable 1208 has a single flat cable conductor with a wire gauge suitable for low voltage drops at high currents (e.g., less than AWG 16 gauge).

Figure 13:
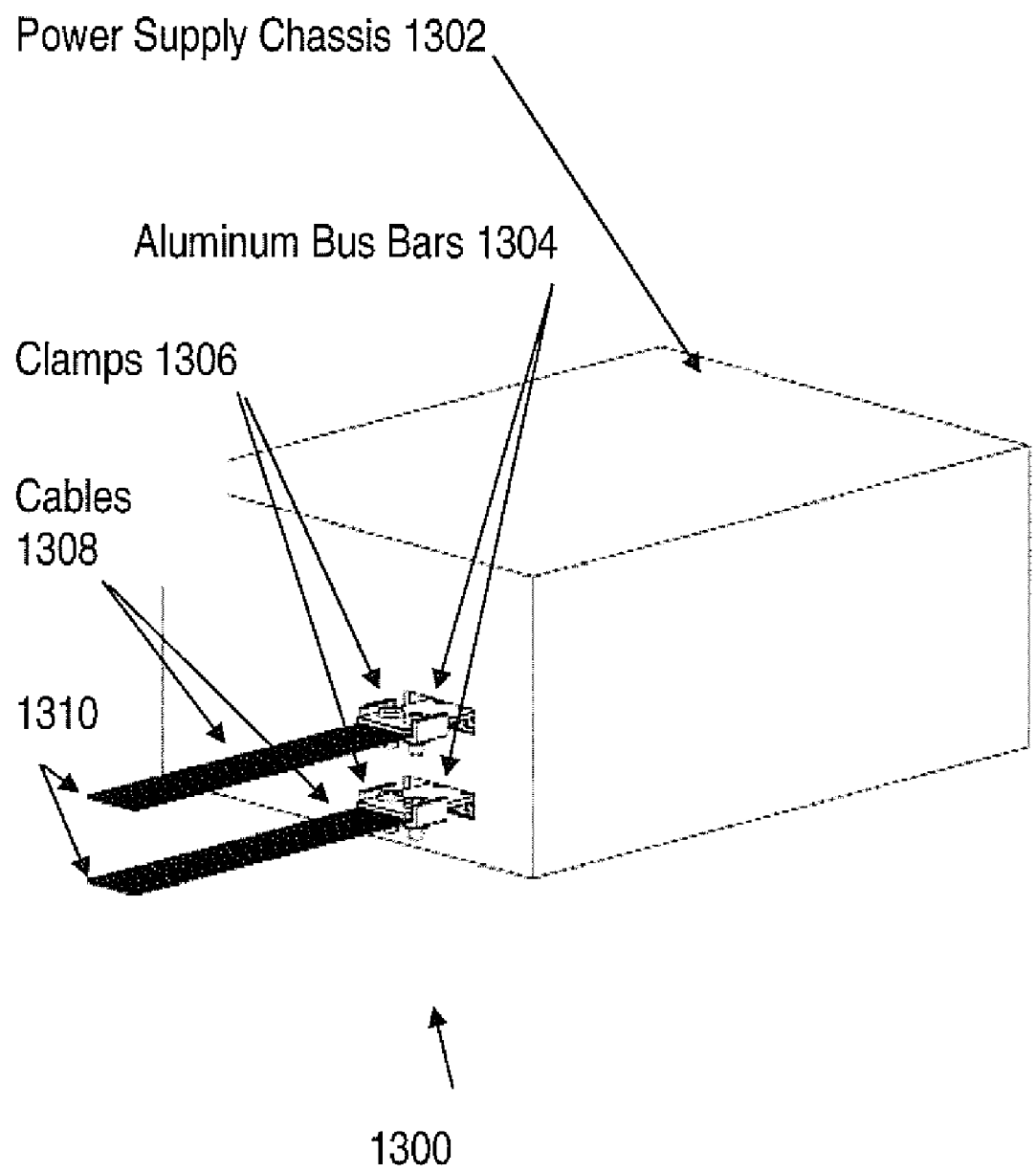
FIG. 13 illustrates the use of bus bars and clamps in a DC modular cable interconnect scheme for use with a PSU that is compatible with PCs and workstations, according to certain embodiments.

According to certain embodiments, FIG. 13 illustrates the use of a bus bar and clamp in a DC modular cable interconnect scheme for use with a PSU that is compatible with PCs and workstations. FIG. 13 shows a PSU chassis 1302, a DC modular cable interconnect 1300 that includes two flat braided power cables 1308 (one for DC voltage and the other for ground return), connectors 1310 (not shown) for connecting to a computer peripheral and clamp connectors 1306 that can be clamped to corresponding bus bars connector 1304 mounted inside a PSU chassis 1302. According to certain embodiments, the metal bus bars are such that wires of the DC modular cable can be secured to the bus bars by screwing, clamping, welding or soldering. The flat braided power cables 1308 are such that they are suitable for low voltage drops at high currents. According to certain embodiments, Litz wire can be used. According to certain embodiments, the aluminum bus bars can be nickel plated first, and then optionally plated with gold to achieve lower contact resistance.

Figure 14:
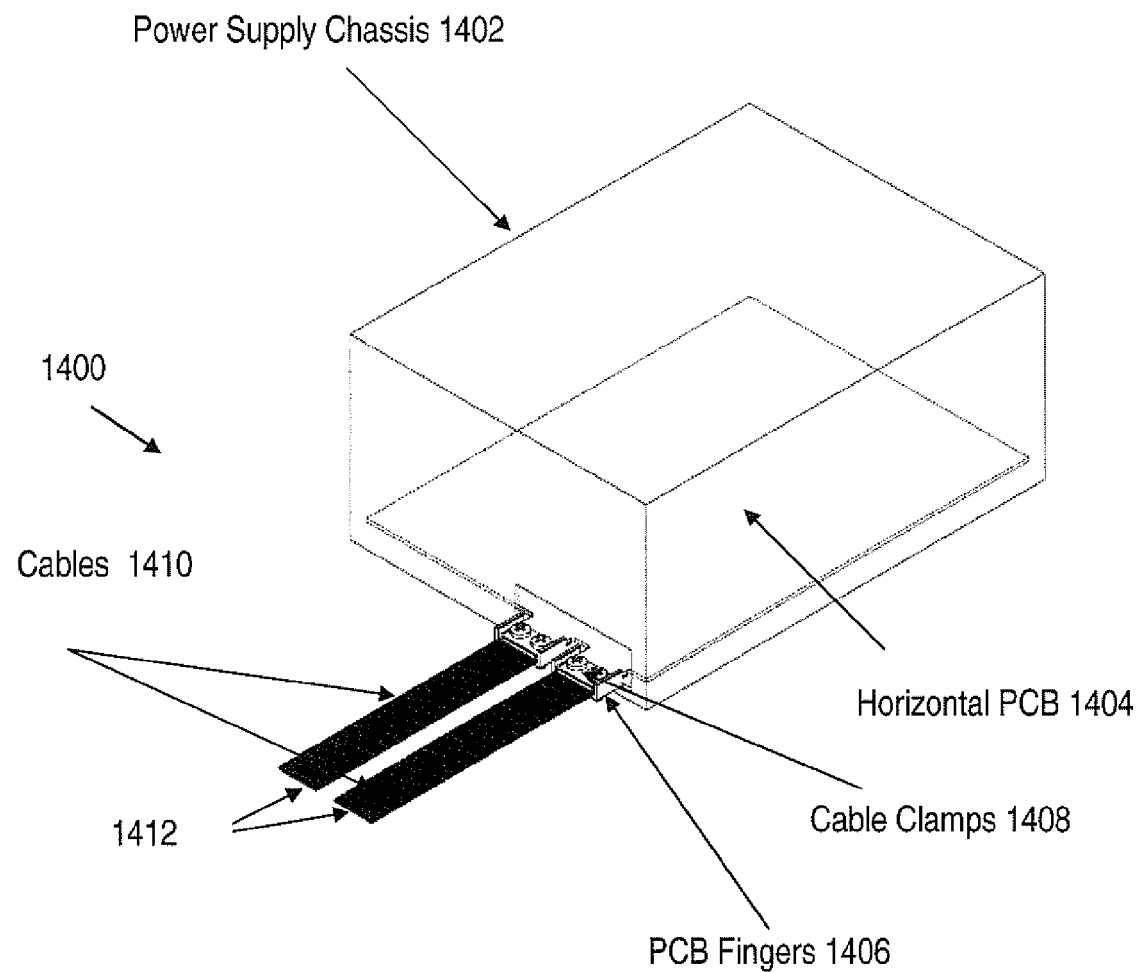
FIG. 14 illustrates the use of an extended horizontal printed circuit board (PCB) in a DC modular cable interconnect scheme for use with a PSU that is compatible with PCs and workstations, according to certain embodiments.

According to certain embodiments, FIG. 14 illustrates the use of an extended horizontal printed circuit board (PCB) in a DC modular cable interconnect scheme for use with a PSU that is compatible with PCs and workstations. FIG. 14 shows a PSU chassis 1402, a DC modular cable interconnect 1400 that includes two flat power cables 1410 (one for DC voltage and the other for ground return), connectors 1412 (not shown) for connecting to a computer peripheral, and an extended horizontal PCB 1404 with PC fingers 1406. The flat power cables 1410 are clamped onto PCB fingers 1406 using cable clamps 1408. According to certain embodiments, the flat cables 1410 can be secured to the PCB fingers 1406 by screwing, clamping, welding or soldering. The flat power cables 1410 are such that they are suitable for low voltage drops at high currents. According to certain embodiments, Litz wire can be used.

Figure 15:
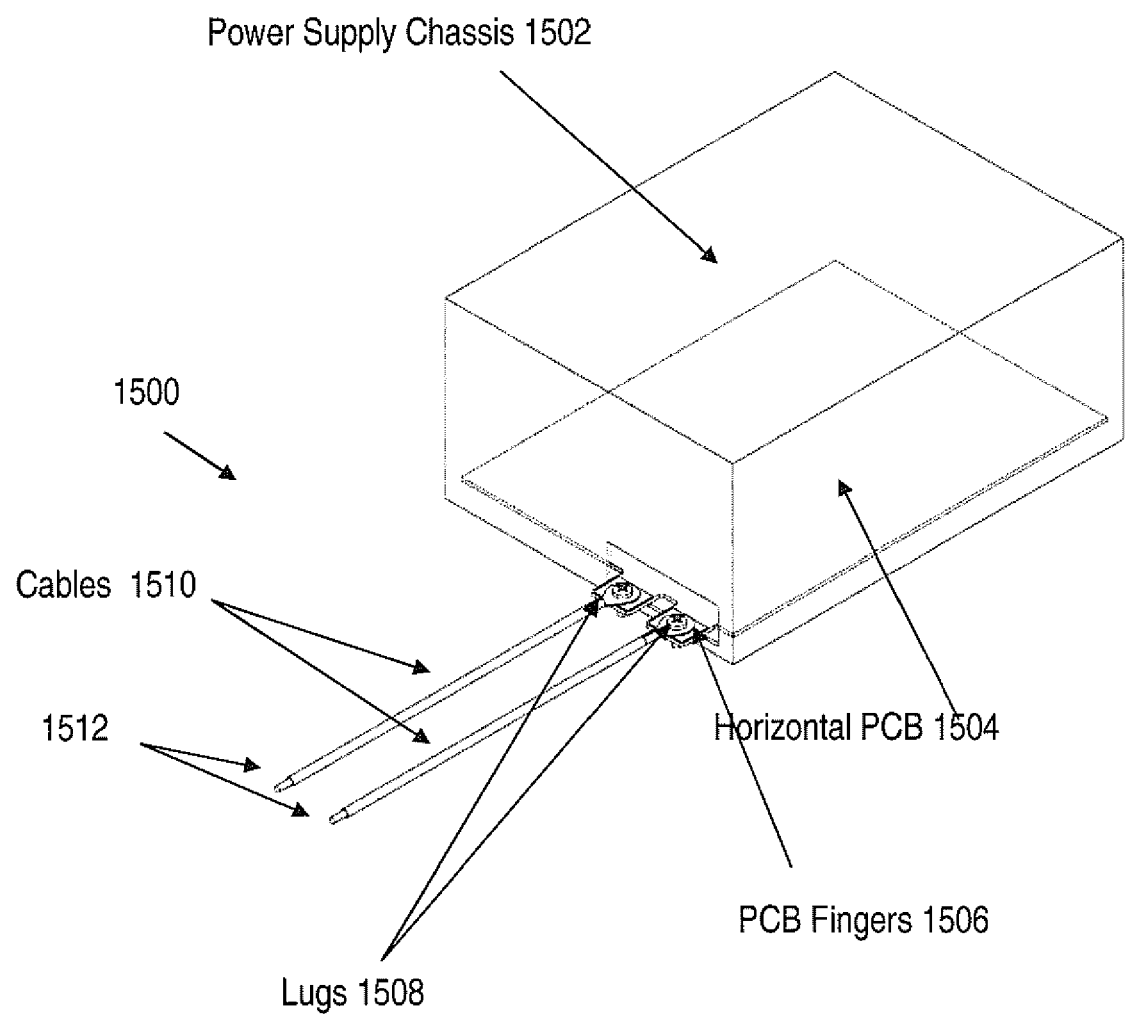
FIG. 15 illustrates the use of an extended horizontal printed circuit board (PCB) in a DC modular cable interconnect scheme for use with a PSU that is compatible with PCs and workstations, according to certain embodiments.

According to certain embodiments, FIG. 15 illustrates the use of an extended horizontal printed circuit board (PCB) in a DC modular cable interconnect scheme for use with a PSU that is compatible with PCs and workstations. FIG. 15 shows a PSU chassis 1502, a DC modular cable interconnect 1500 that includes two power cables 1510 (one for DC voltage and the other for ground return), connectors 1512 (not shown) for connecting to a computer peripheral, and an extended horizontal PCB 1504 with PC fingers 1506. The power cables 1510 have lugs 1508 that are clamped onto PCB fingers 1506. According to certain embodiments, the cables 1510 can be secured to the PCB fingers 1506 by screwing, clamping, welding or soldering. The power cables 1510 are such that they are suitable for low voltage drops at high currents.

According to certain embodiments, with respect to DC modular cables used with PSUs, instead of using a bundle of wires to hard wire the DC output electronics from a horizontally oriented PSU main PCB (horizontal PCB) containing the PSU's output electronics to a vertically oriented PCB (vertical connector PCB) where the modular cable connector outlets are mounted, various PCB interconnect schemes can be used as illustrated in FIGS. 16-23 to increase reliability and efficiency of the PSU. According to some embodiments, such PCB interconnect schemes are low resistance interconnect schemes. For purposes of explanation, the embodiments are described using a vertically oriented connector PCB and a horizontally oriented PSU main PCB. However, the embodiments are not limited to such an orientation.

Figure 16:
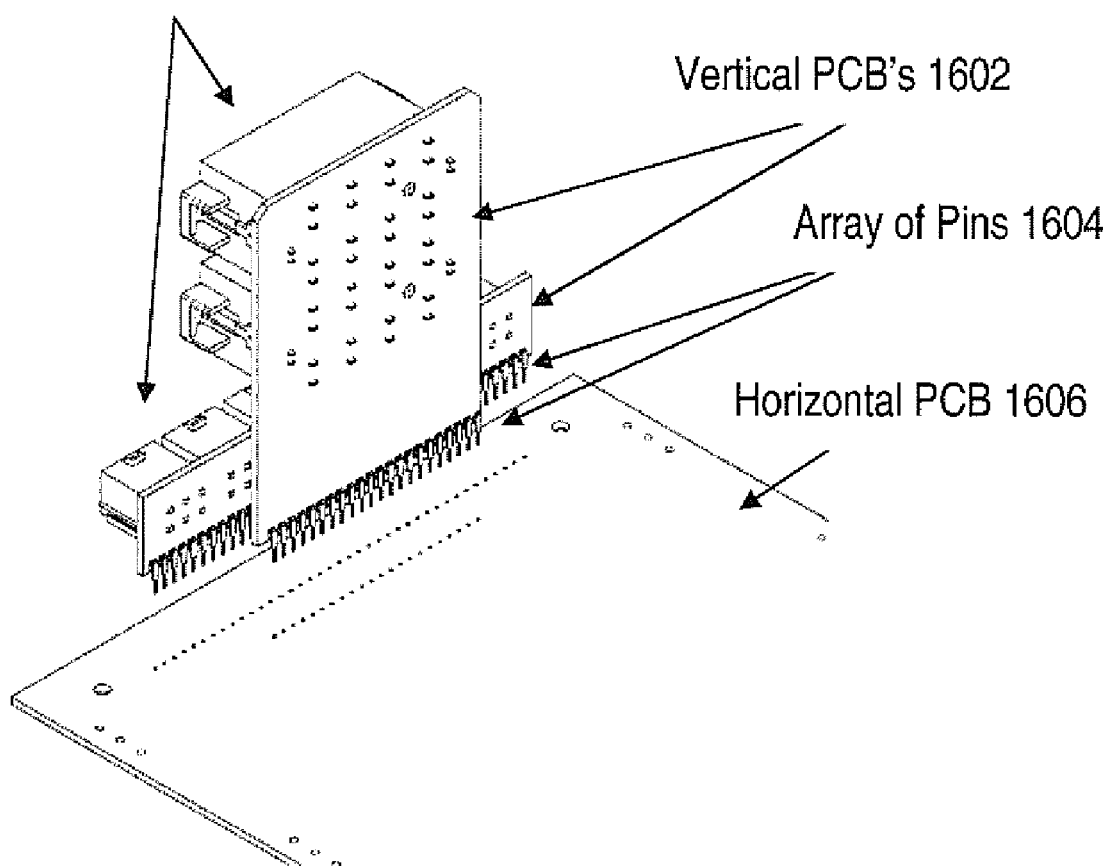
FIG. 16 illustrates the use of a pin interface between the horizontal PCB and the vertical connector PCB to replace the wire bundle that would have been used to hard wire the horizontal PCB to the vertical connector PCB in a PSU, according to certain embodiments.

According to certain embodiments, FIG. 16 illustrates the use of a pin interface between the horizontal PCB and the vertical connector PCB to replace the wire bundle that would have been used to hard wire the horizontal PCB to the vertical connector PCB in a PSU. FIG. 16 shows two vertical connector PCBs 1602 that are connected to horizontal PCB 1606 through a respective array of pins 1604. Each vertical connector PCB is installed with one or more DC connector outlets 1603 to which DC modular cables can be connected. The embodiments are not limited to two vertical connector PCBs. According to certain embodiments, the respective array of pins 1604, each of which is capable of carrying relatively high currents (on the order of a few amps), is soldered to its respective vertical connector PCB. Each vertical connector PCB is soldered to the horizontal PCB in the PSU which allows high currents to be transferred between vertical connector PCBs and the horizontal PCB with low voltage drops. According to certain embodiments, there are N+1 vertical boards, where N is equal to or greater than 1. The Nth vertical board is closer to the opening of the power supply chassis than the N+1th vertical board. The N+1th vertical board has a greater height that the Nth vertical board to allow DC connector outlets to be installed on each of the N vertical boards.

Figure 17:
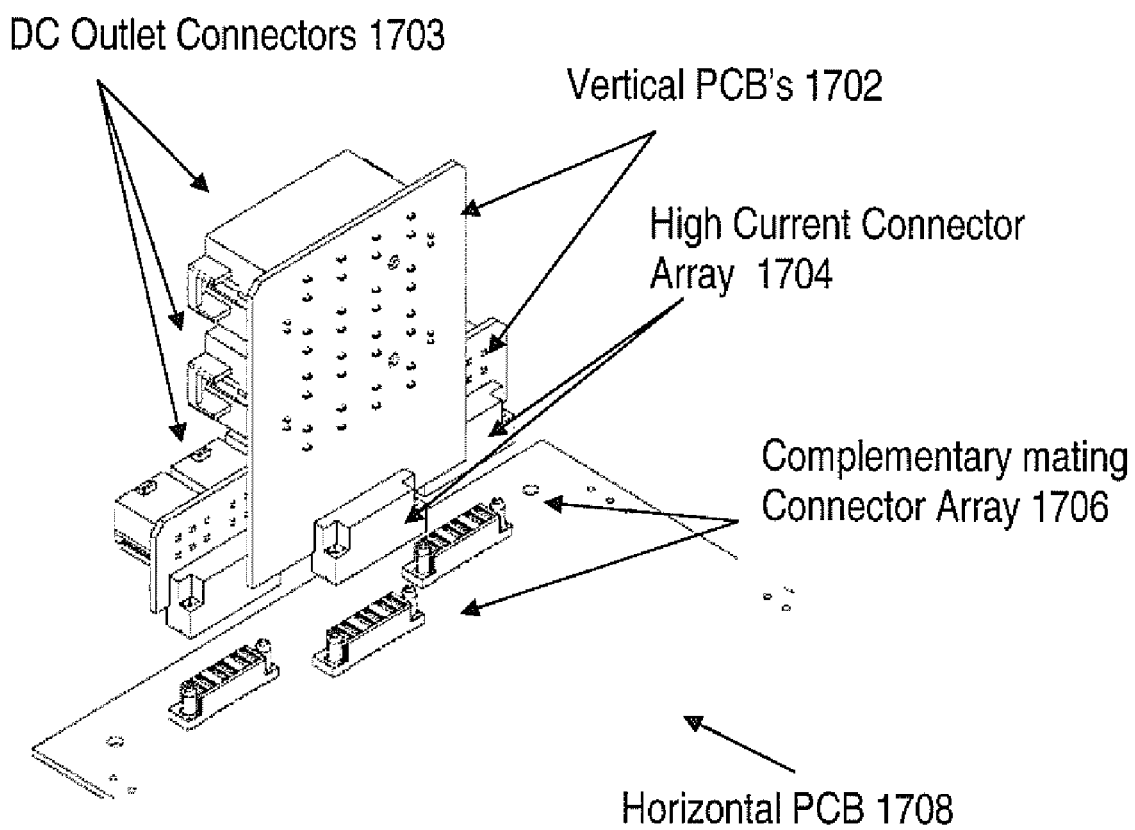
FIG. 17 illustrates the use of an array of high current connectors to interface between the horizontal PCB and the vertical connector PCB to replace the wire bundle that would have been used to hard wire the horizontal PCB to the vertical connector PCB in a PSU, according to certain embodiments.

According to certain embodiments, FIG. 17 illustrates the use of a high current connector array interface between the horizontal PCB and the vertical connector PCB to replace the wire bundle that would have been used to hard wire the horizontal PCB to the vertical connector PCB in a PSU. FIG. 17 shows two vertical connector PCBs 1702 each vertical connector PCB is installed with one or more DC connector outlets 1703 to which DC modular cables can be connected. The embodiments are not limited to two vertical connector PCBs. Soldered to each vertical connector PCB 1702 is a respective high current connector array 1704. Each high current connector in the array 1704 comprises a large array of pins, each of which is capable of carrying relatively high currents (on the order of a few amps). Complementary mating connector arrays 1706 are soldered to the horizontal PCB 1708 in the PSU. Each vertical connector PCB 1702 can be connected to the horizontal PCB 1708 in the PSU by mating each high current connector array 1704 with its counterpart complementary mating connector array 1706, which allows high currents to be transferred between vertical connector PCBs and the horizontal PCB with low voltage drops. According to certain embodiments, there are N+1 vertical boards, where N is equal to or greater than 1. The Nth vertical board is closer to the opening of the power supply chassis than the N+1th vertical board. The N+1th vertical board has a greater height that the Nth vertical board to allow DC connector outlets to be installed on each of the N vertical boards.

Figure 18:
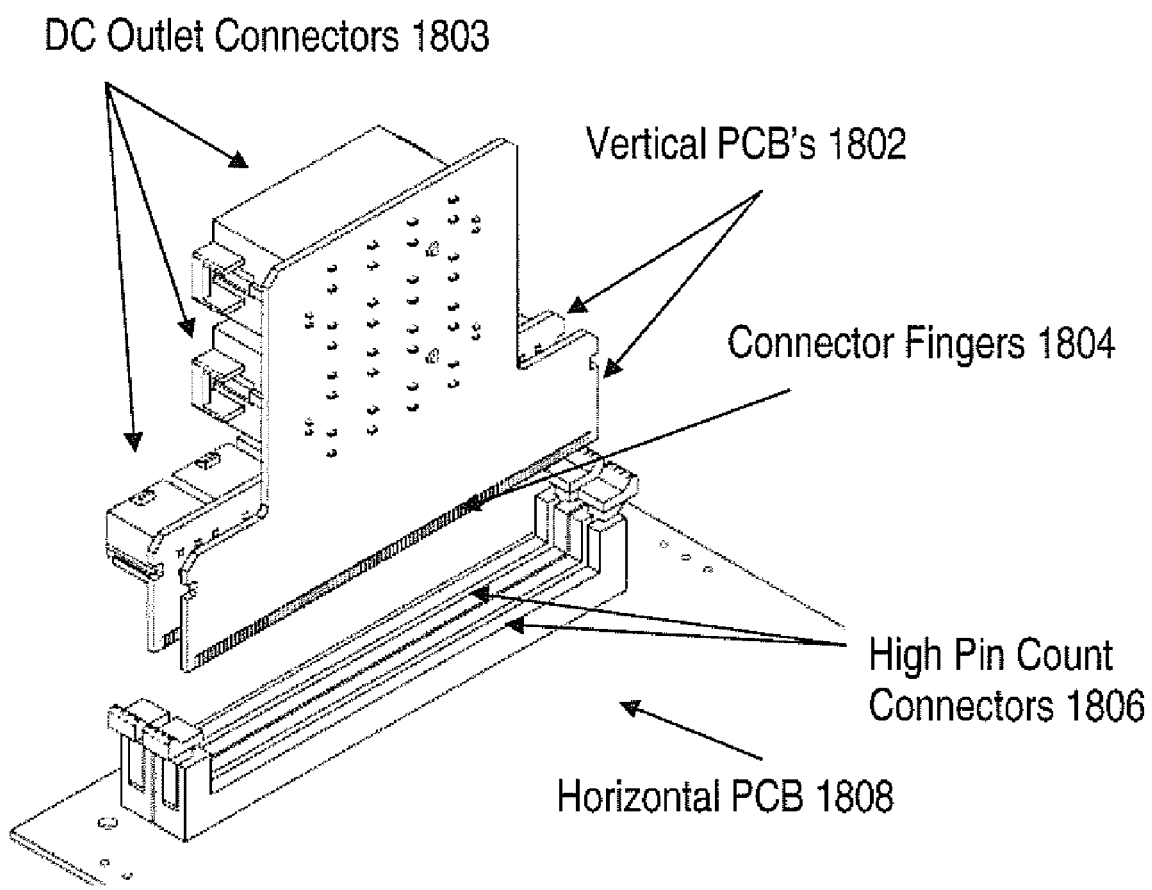
FIG. 18 illustrates the use of multiple arrays of connector fingers and multiple high pin count connectors as an interface between the horizontal PCB and the vertical connector PCB to replace the wire bundle that would have been used to hard wire the horizontal PCB to the vertical connector PCB in a PSU, according to certain embodiments.

According to certain embodiments, FIG. 18 illustrates the use of connector fingers array and high pin count connector array interface between the horizontal PCB and the vertical connector PCB to replace the wire bundle that would have been used to hard wire the horizontal PCB to the vertical connector PCB in a PSU. FIG. 18 shows two vertical connector PCBs 1802. each vertical connector PCB is installed with one or more DC connector outlets 1803 to which DC modular cables can be connected. The embodiments are not limited to two vertical connector PCBs. Each vertical connector PCB 1802 is etched with a respective array of connector fingers 1804. Respective complementary high pin count connector arrays 1806 are soldered to the horizontal PCB 1808 in the PSU. Each vertical connector PCB can be connected to the horizontal PCB in the PSU by mating each array connector fingers 1804 with its counterpart complementary high pin count connector arrays 1806, which allows high currents to be transferred between vertical connector PCBs and the horizontal PCB with low voltage drops. According to certain embodiments, there are N+1 vertical boards, where N is equal to or greater than 1. The Nth vertical board is closer to the opening of the power supply chassis than the N+1th vertical board. The N+1th vertical board has a greater height that the Nth vertical board to allow DC connector outlets to be installed on each of the N vertical boards.

Figure 19:
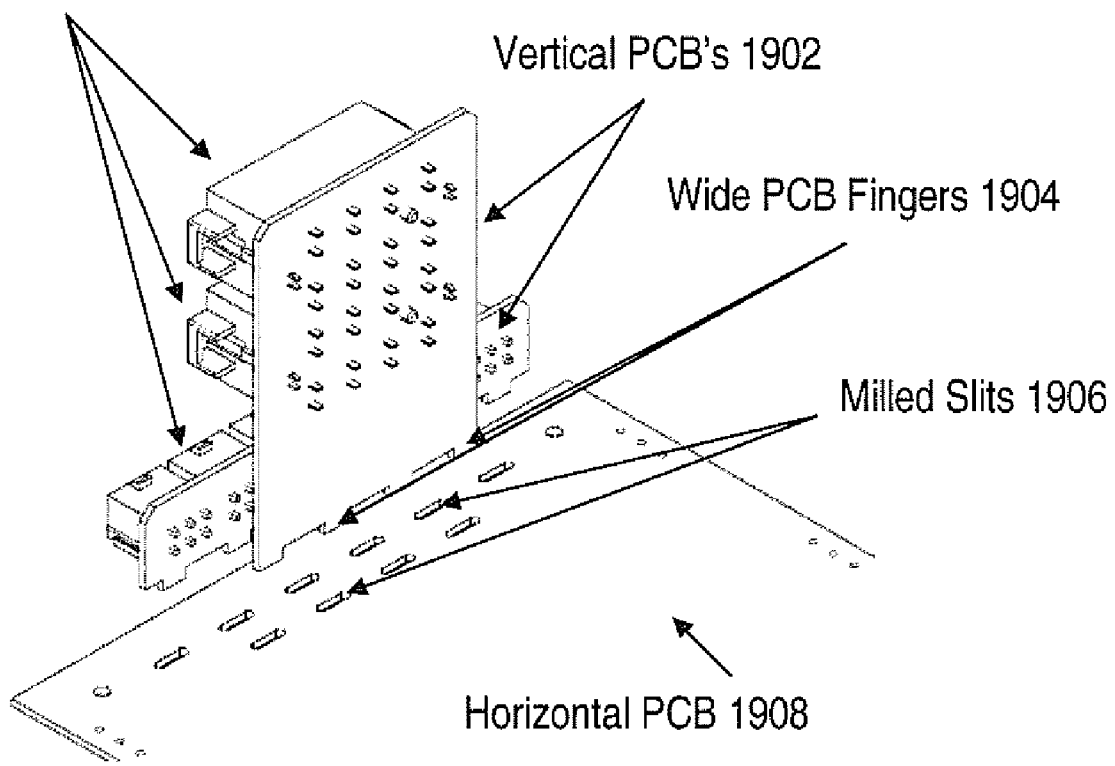
FIG. 19 illustrates the use of multiple wide fingers and corresponding milled slits as an interface between the horizontal PCB and the vertical connector PCB to replace the wire bundle that would have been used to hard wire the horizontal PCB to the vertical connector PCB in a PSU, according to certain embodiments.

According to certain embodiments, FIG. 19 illustrates the use of wide fingers connector array and corresponding milled slits interface between the horizontal PCB and the vertical connector PCB to replace the wire bundle that would have been used to hard wire the horizontal PCB to the vertical connector PCB in a PSU. FIG. 19 shows two vertical connector PCBs 1902, each vertical connector PCB is installed with one or more DC connector outlets 1903 to which DC modular cables can be connected. The embodiments are not limited to two vertical connector PCBs. Each vertical connector PCB 1902 is etched or routed with a plurality of wide fingers 1904 separated by routed gaps, for example. Respective complementary slits 1906 are milled into the horizontal PCB 1908 in the PSU. Each vertical connector PCB can be connected to the horizontal PCB in the PSU by mating each of wide fingers 1904 with its counterpart complementary slit 1906 on the horizontal PCB 1908 and soldering the mated pair. The large trace areas on the wide fingers 1904 allow high currents to be transferred between vertical connector PCBs and the horizontal PCB with low voltage drops. According to certain embodiments, the wide fingers 1904 and milled slits 1906 can be nickel plated first, and then optionally plated with gold to achieve lower contact resistance. According to certain embodiments, there are N+1 vertical boards, where N is equal to or greater than 1. The Nth vertical board is closer to the opening of the power supply chassis than the N+1th vertical board. The N+1th vertical board has a greater height that the Nth vertical board to allow DC connector outlets to be installed on each of the N vertical boards.

Figure 20:
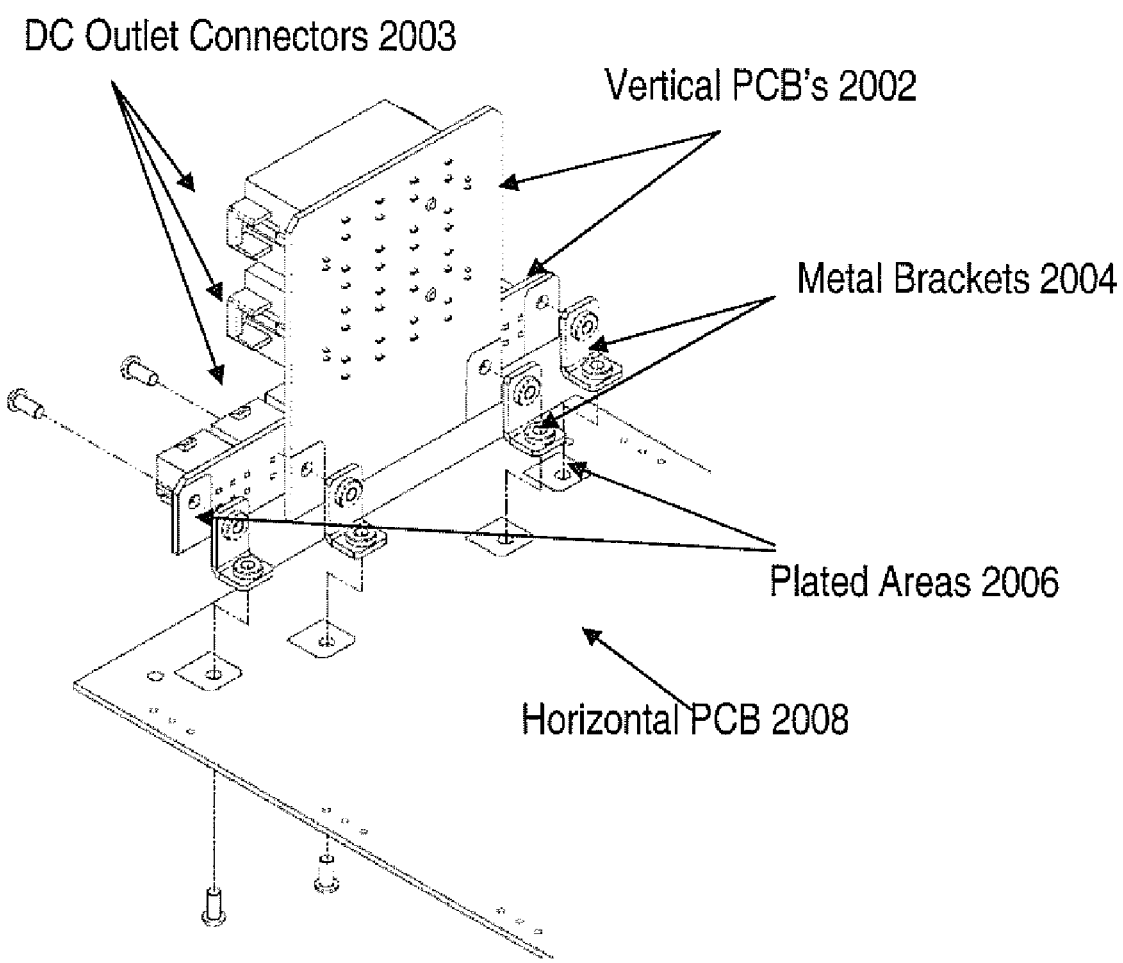
FIG. 20 illustrates the use of an array of right angle metal brackets to interface between the horizontal PCB and the vertical connector PCB to replace the wire bundle that would have been used to hard wire the horizontal PCB to the vertical connector PCB in a PSU, according to certain embodiments.

According to certain embodiments, FIG. 20 illustrates the use of right angle metal bracket interface between the horizontal PCB and the vertical connector PCB to replace the wire bundle that would have been used to hard wire the horizontal PCB to the vertical connector PCB in a PSU. FIG. 20 shows two vertical connector PCBs 2002, each vertical connector PCB is installed with one or more DC connector outlets 2003 to which DC modular cables can be connected. The embodiments are not limited to two vertical connector PCBs. FIG. 20 also shows a horizontal PCB 2008. Each vertical connector PCB 2002 and the horizontal PCB 2008 includes respective plated areas 2006 to which are attached corresponding right angle metal brackets 2004. Each plated area 2006 has at least one hole. For example, one edge of each right angle metal bracket 2004 makes contact with a corresponding copper area etched into each vertical PCB. On each right angle metal bracket 2004 may be installed two or more captive nuts. Screws may be inserted through the holes in the copper plated areas 2006 of each vertical PCB and horizontal PCB and tightened into each right angle metal bracket 2004 at the location of the corresponding captive nuts. Thus, each vertical connector PCB 2002 is connected to the horizontal PCB 2008 in the PSU and allows high currents to be transferred between vertical connector PCBs and the horizontal PCB with low voltage drops. According to certain embodiments, the right angle metal brackets 2004 and plated areas 2006 can be nickel plated first, and then optionally plated with gold to achieve lower contact resistance. According to certain embodiments, there are N+1 vertical boards, where N is equal to or greater than 1. The Nth vertical board is closer to the opening of the power supply chassis than the N+1th vertical board. The N+1th vertical board has a greater height that the Nth vertical board to allow DC connector outlets to be installed on each of the N vertical boards.

Figure 21:
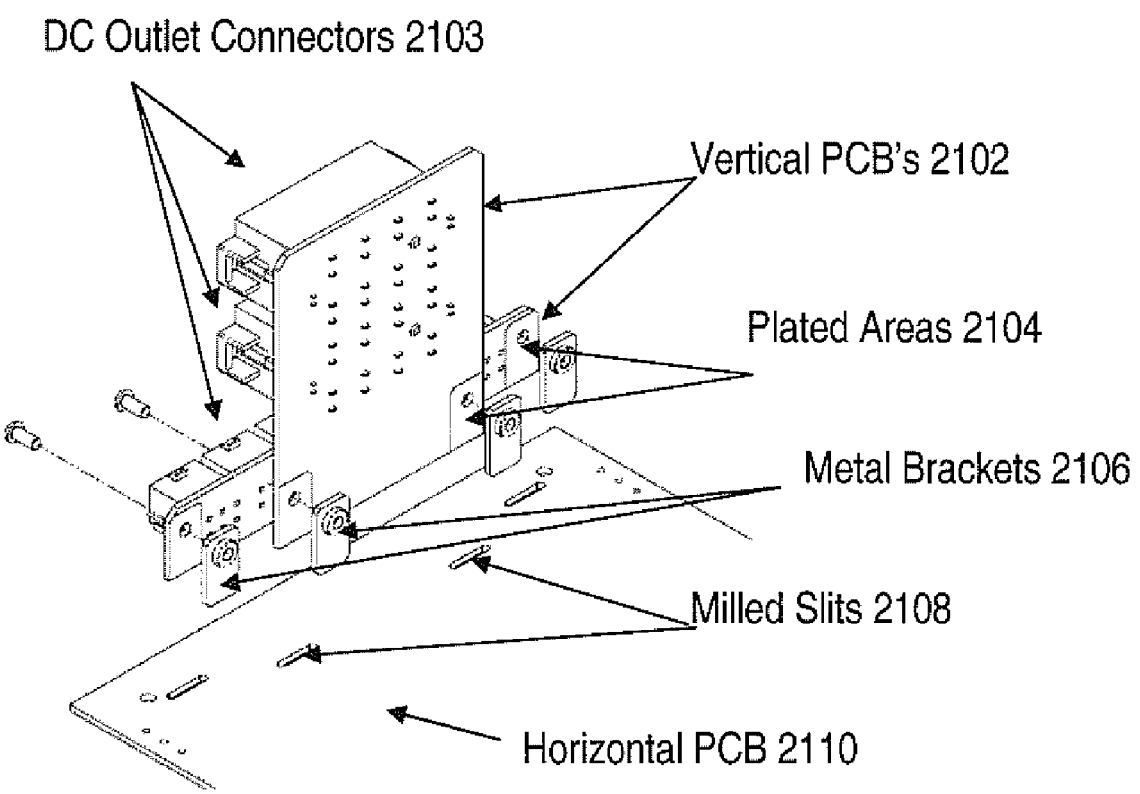
FIG. 21 illustrates the use of an array of straight metal brackets and corresponding milled slits to interface between the horizontal PCB and the vertical connector PCB to replace the wire bundle that would have been used to hard wire the horizontal PCB to the vertical connector PCB in a PSU, according to certain embodiments.

According to certain embodiments, FIG. 21 illustrates the use of straight metal brackets and corresponding milled slits interface between the horizontal PCB and the vertical connector PCB to replace the wire bundle that would have been used to hard wire the horizontal PCB to the vertical connector PCB in a PSU. FIG. 21 shows two vertical connector PCBs 2102, each vertical connector PCB is installed with one or more DC connector outlets 2103 to which DC modular cables can be connected. The embodiments are not limited to two vertical connector PCBs. Each vertical connector PCB 2102 includes copper plated areas 2104 to which are attached corresponding straight metal brackets 2106. Each plated area 2104 has at least one hole. For example, one edge of each straight metal bracket 2106 makes contact with a corresponding area etched into each vertical PCB. On each straight metal bracket 2106 may be installed one or more captive nuts at locations where the vertical PCB is to be secured to the straight metal brackets 2106. Screws may be inserted through the holes in the copper plated areas 2104 of each vertical PCB and tightened into each metal bracket 2106 at the location of the corresponding captive nut. Respective complementary slits 2108 are milled into the horizontal PCB 2110 in the PSU. Each vertical connector PCB 2102 can be connected to the horizontal PCB 2110 in the PSU by mating each of the metal brackets 2106 into its counterpart complementary slit 2108 on the horizontal PCB 2110 and soldering the mated pair. According to certain embodiments, the metal brackets 2106 are plated with an alloy that allows them to be soldered into slits 2108. According to certain embodiments straight metal brackets can be nickel plated first, and then optionally plated with gold to achieve lower contact resistance. Thus, each vertical connector PCB 2102 is connected to the horizontal PCB 2108 in the PSU and allows high currents to be transferred between vertical connector PCBs and the horizontal PCB with low voltage drops. According to certain embodiments, there are N+1 vertical boards, where N is equal to or greater than 1. The Nth vertical board is closer to the opening of the power supply chassis than the N+1th vertical board. The N+1th vertical board has a greater height that the Nth vertical board to allow DC connector outlets to be installed on each of the N vertical boards.

Figure 22:
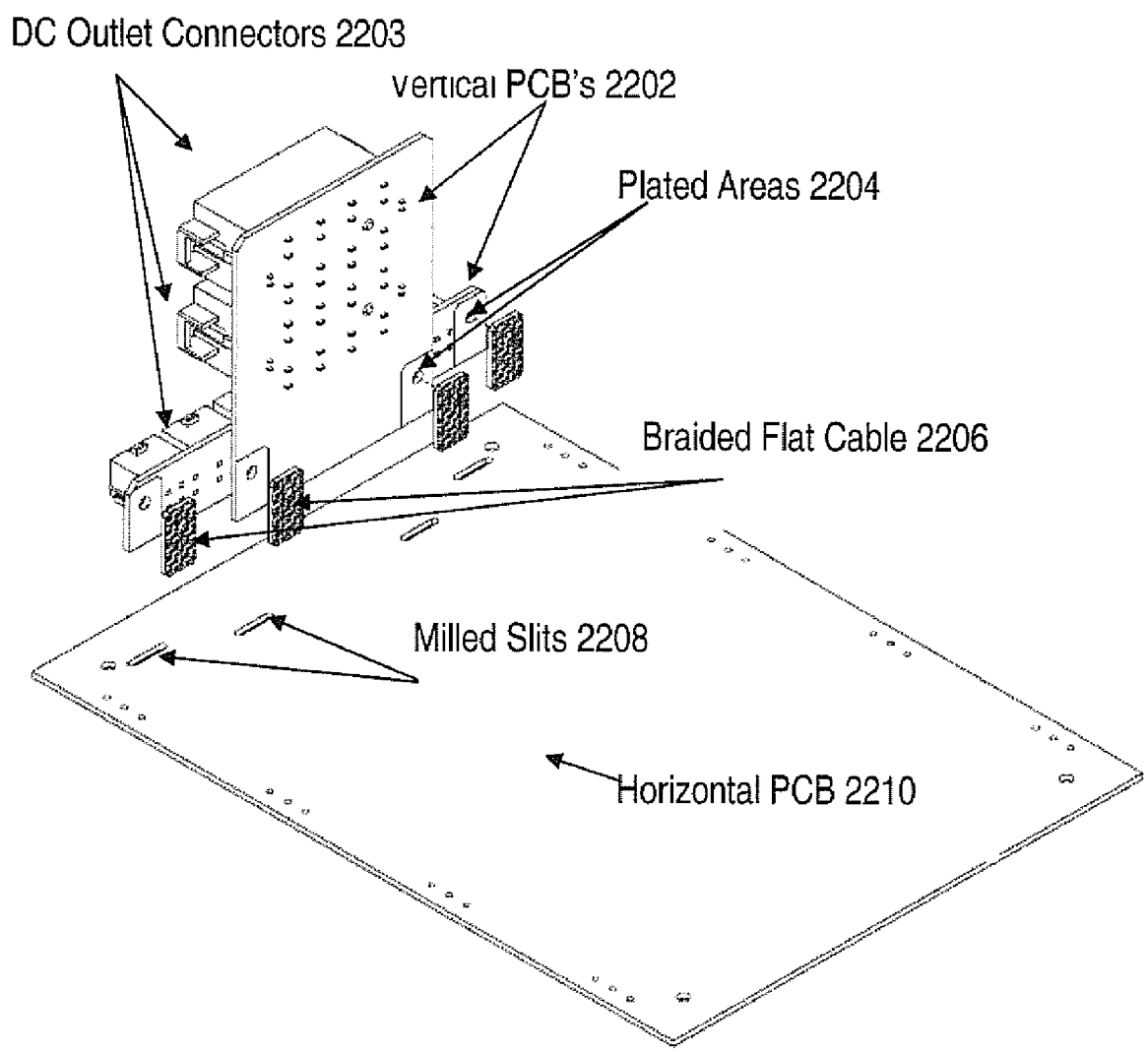
FIG. 22 illustrates the use of braided flat cables and corresponding milled slits interface between the horizontal PCB and the vertical connector PCB to replace the wire bundle that would have been used to hard wire the horizontal PCB to the vertical connector PCB in a PSU, according to certain embodiments.

According to certain embodiments, FIG. 22 illustrates the use of braided flat cable and corresponding milled slits interface between the horizontal PCB and the vertical connector PCB to replace the wire bundle that would have been used to hard wire the horizontal PCB to the vertical connector PCB in a PSU. FIG. 22 shows two vertical connector PCBs 2202, each vertical connector PCB is installed with one or more DC connector outlets 2203 to which DC modular cables can be connected. The embodiments are not limited to two vertical connector PCBs. Each vertical connector PCB 2202 includes copper plated areas 2204 to which are attached corresponding flat braided cables 2206. Each plated area 2204 has at least one hole. For example, one edge of each flat braided cable 2206 makes contact with a corresponding area etched into each vertical PCB. Behind each flat braided cable 2206 may be installed flat washers and nuts (not shown) at locations where the vertical PCB is to be secured to the flat braided cables 2206. Screws (not shown) may be inserted through the holes in the copper plated areas 2204 of each vertical PCB through each flat braided cable 2206 and flat washer (not shown) and secured by the corresponding nut (not shown). Respective complementary slits 2208 are milled into the horizontal PCB 2210 in the PSU. Each vertical connector PCB 2202 can be connected to the horizontal PCB 2210 in the PSU by mating each of the flat braided cables 2206 into its counterpart complementary slit 2208 on the horizontal PCB 2210 and soldering the mated pair. According to certain embodiments, the flat braided cables 2206 are plated with an alloy that allows them to be soldered into slits 2208. According to certain embodiments metal brackets can be nickel plated first, and then optionally plated with gold to achieve lower contact resistance. Thus, each vertical connector PCB 2202 is connected to the horizontal PCB 2208 in the PSU and allows high currents to be transferred between vertical connector PCBs and the horizontal PCB with low voltage drops. According to certain embodiments, there are N+1 vertical boards, where N is equal to or greater than 1. The Nth vertical board is closer to the opening of the power supply chassis than the N+1th vertical board. The N+1th vertical board has a greater height that the Nth vertical board to allow DC connector outlets to be installed on each of the N vertical boards.

Figure 23:
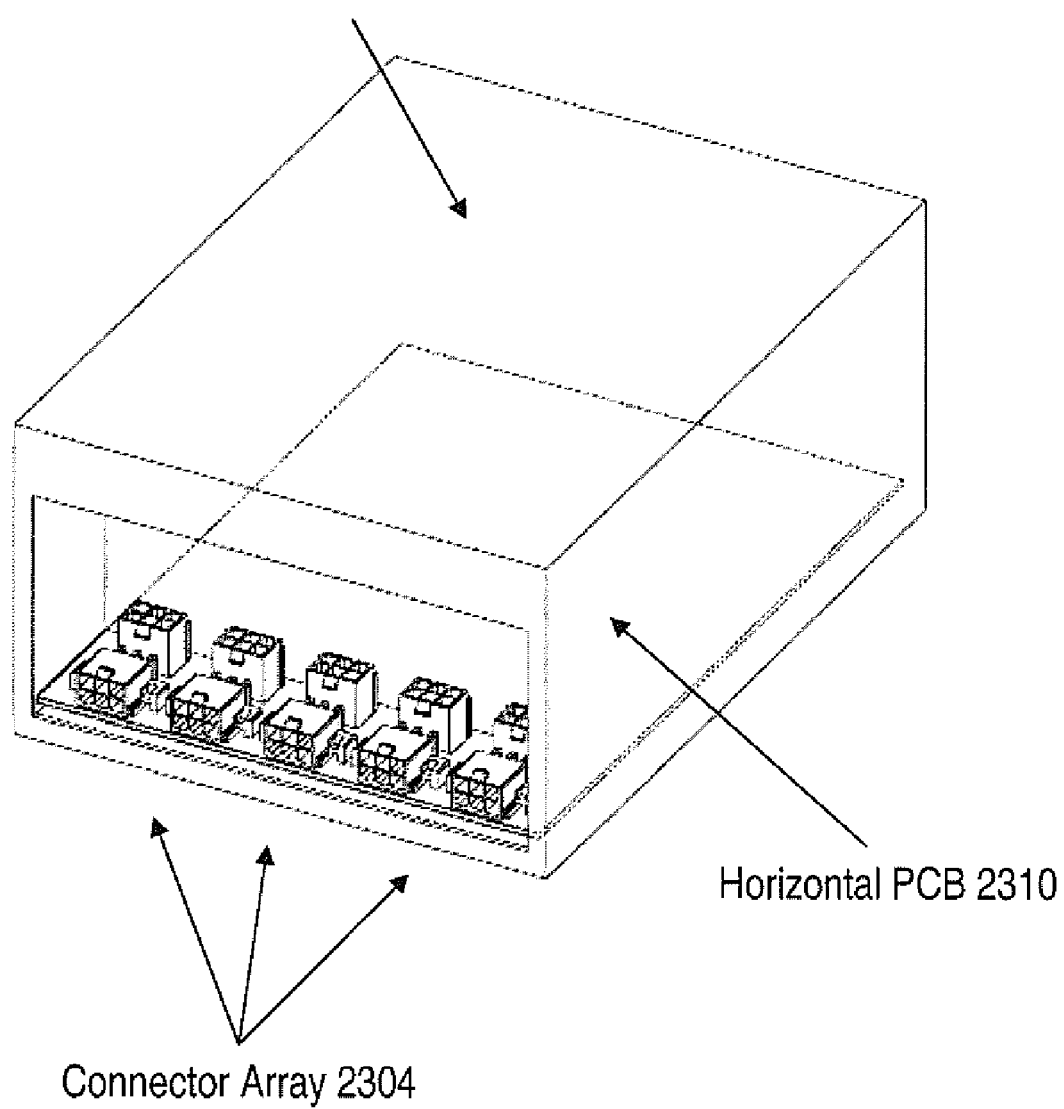
FIG. 23 illustrates the use of a plurality of connector arrays mounted directly on a horizontal PCB, the plurality of connector arrays for use as DC modular cable outlets, according to certain embodiments.

According to certain embodiments, FIG. 23 illustrates the use of a plurality of connector arrays mounted directly on a horizontal PCB, the plurality of connector arrays for use as DC modular cable outlets. FIG. 23 shows a PSU chassis 2302, a horizontal printed circuit board (PCB) 2310 and a plurality of connector rows 2304 (only 2 rows are shown and wherein the plurality is two or more rows) mounted directly on a horizontal PCB 2310. The plurality of connector rows 2304 is not limited to 2 rows. According to certain embodiments, there may be more than 2 rows. Each of the connectors in the connector rows 2304 serve as a DC modular cable outlet. FIG. 23 shows one of the connector rows 2304 oriented horizontally while the other connector row 2304 is oriented vertically.

According to certain embodiments, the plurality of connector rows 2304 may all be oriented vertically According to other embodiments, the first set of connector rows 2304 closest to the chassis wall (outermost row of connectors) is oriented horizontally while the rest of the plurality of connector rows 2304 are oriented vertically. According to certain other embodiments, the plurality of connector rows 2304 may be used in conjunction with N vertical boards as described herein with reference to FIGS. 16-22, where N is equal to or greater than 1. The plurality of connector rows 2304 are closer to the opening of the power supply chassis than the N vertical boards. The N−1th vertical board is closer to the opening of the power supply chassis than the Nth vertical board. The Nth vertical board has a greater height that the N−1th vertical board to allow DC connector outlets to be installed on each of the N vertical boards. According to certain embodiments, only one connector row 2304 is used in conjunction with N+1 vertical boards, where N is equal to or greater than 1. The single connector row 2304 is closer to the opening of the power supply chassis than the N+1 vertical boards. The Nth vertical board is closer to the opening of the power supply chassis than the N+1th vertical board. The N+1th vertical board has a greater height that the Nth vertical board to allow DC connector outlets to be installed on each of the N+1th vertical boards In the foregoing specification, embodiments of the invention have been described with reference to numerous specific details that may vary from implementation to implementation. Thus, the sole and exclusive indicator of what the invention is and what is intended by the applicants to be the invention, is the set of claims that issue from this application, in the specific form in which such claims issue, including any subsequent correction. Any express definitions set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

I claim:

1. An ATX compatible power supply unit for use with a computer, the ATX compatible power supply unit comprising:
   a chassis;
   a main printed circuit board that includes at least a subset of the power supply's output electronics;
   wherein the main printed circuit board has an extended portion through a cutout in the chassis, wherein the extended portion includes a row of outlet connectors for use with DC modular cables and N+1 connector printed circuit boards arranged substantially parallel to the row of outlet connectors, each of the N+1 connector printed circuit boards includes one or more outlet connectors for use with DC modular cables, wherein N is an integer and is equal to or greater than 1 and wherein the N+1 connector printed circuit boards are connected to the main printed circuit board with connectors other than bare or insulated wires to allow high currents to be transferred between the N+1 printed circuit boards and the main printed circuit board at low voltage drops.

2. The ATX compatible power supply unit of claim 1, wherein at least one connector printed circuit board is configured with an array of pins, wherein the array of pins is capable of carrying high currents and the array of pins is attached to the main printed circuit board to allow high currents to be transferred between the at least one connector printed circuit board and the main printed circuit board at low voltage drops.

3. The ATX compatible power supply unit of claim 2 wherein the array of pins is attached to the main printed circuit board by soldering the array of pins to the main printed circuit board.

4. The ATX compatible power supply unit of claim 2 wherein the array of pins is attached to the main printed circuit board by mating the array of pins with a complementary set of mating connectors on the main printed circuit board.

5. The ATX compatible power supply unit of claim 1, wherein at least one connector printed circuit board is configured with an array of connector fingers, wherein the array of connector fingers is attached to the main printed circuit board to allow high currents to be transferred between the at least one connector printed circuit board and the main printed circuit board at low voltage drops.

6. The ATX compatible power supply unit of claim 5, wherein the array of connector fingers is attached to the main printed circuit board by mating the array of connector fingers with a complementary set of mating high pin count connectors on the main printed circuit board.

7. The ATX compatible power supply unit of claim 1, wherein at least one connector printed circuit board is configured with a plurality of wide fingers separated by routed gaps, wherein the plurality of wide fingers separated by routed gaps is attached to the main printed circuit board to allow high currents to be transferred between the at least one connector printed circuit board and the main printed circuit board at low voltage drops.

8. The ATX compatible power supply unit of claim 7, wherein the plurality of wide fingers separated by routed gaps is attached to the main printed circuit board by inserting the plurality of wide fingers into a complementary set of slits on the main printed circuit board.

9. The ATX compatible power supply unit of claim 8, further comprising soldering the plurality of wide fingers separated by routed gaps to the complementary set of slits after inserting the plurality of wide fingers into the complementary set of slits.

10. The ATX compatible power supply unit of claim 1, wherein at least one connector printed circuit board is configured with angled metal brackets, wherein the angled metal brackets are attached to the main printed circuit board to allow high currents to be transferred between the at least one connector printed circuit board and the main printed circuit board at low voltage drops.

11. The ATX compatible power supply unit of claim 10, wherein the angled metal brackets are screwed onto the at least one connector printed circuit board and the main printed circuit board.

12. The ATX compatible power supply unit of claim 1, wherein at least one connector printed circuit board is configured with straight metal brackets, wherein the straight metal brackets are attached to the main printed circuit board to allow high currents to be transferred between the at least one connector printed circuit board and the main printed circuit board at low voltage drops.

13. The ATX compatible power supply unit of claim 12, wherein the straight metal brackets are attached to the main printed circuit board by inserting the straight metal brackets into a complementary set of slits on the main printed circuit board.

14. The ATX compatible power supply unit of claim 13, further comprising soldering the straight metal brackets to the complementary set of slits after inserting the straight metal brackets into the complementary set of slits.

15. The ATX compatible power supply unit of claim 1, wherein the extended portion is routed into a plurality of sub-portions, the sub-portions being plated with conductive material.

16. The ATX compatible power supply unit of claim 15, wherein DC modular cables with metal bracket terminations are connected to the plated sub-portions by any one of: soldering, clamps, or bolts.

17. The ATX compatible power supply unit of claim 15, wherein DC modular cables with lug terminations are connected to the plated sub-portions by bolts.

18. The ATX compatible power supply unit of claim 1, wherein the extended portion includes two or more rows of outlet connectors for use with DC modular cables.

19. The ATX compatible power supply unit of claim 18, wherein the two or more rows of outlet connectors are oriented vertically.

20. The ATX compatible power supply unit of claim 18, wherein the outermost array of outlet connectors is oriented horizontally and the remainder of the two or more rows of outlet connectors are oriented vertically.

21. The ATX compatible power supply unit of claim 1, wherein the N+1th connector printed board has a height greater than the Nth connector printed board, the Nth connector printed board being closer than the N+1th connector printed board to an opening in the chassis for accessibility to the one or more outlet connectors for use with DC modular cables.

22. The ATX compatible power supply unit of claim 1, further including metallic standoffs for connecting the N+1 connector printed circuit boards to the main printed circuit board.

* * * * *